United States Patent
Tamaso

(10) Patent No.: US 9,263,347 B2
(45) Date of Patent: Feb. 16, 2016

(54) METHOD OF MANUFACTURING SILICON CARBIDE SEMICONDUCTOR DEVICE

(71) Applicant: Sumitomo Electric Industries, Ltd., Osaka-shi (JP)

(72) Inventor: Hideto Tamaso, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/657,341

(22) Filed: Mar. 13, 2015

(65) Prior Publication Data

US 2015/0303119 A1 Oct. 22, 2015

(30) Foreign Application Priority Data

Apr. 17, 2014 (JP) ................. 2014-085711

(51) Int. Cl.

| H01L 21/00 | (2006.01) |
|---|---|
| H01L 21/66 | (2006.01) |
| H01L 21/02 | (2006.01) |
| H01L 21/04 | (2006.01) |
| H01L 23/544 | (2006.01) |
| H01L 29/66 | (2006.01) |

(52) U.S. Cl.
CPC .......... *H01L 22/10* (2013.01); *H01L 21/02378* (2013.01); *H01L 21/02433* (2013.01); *H01L 21/02529* (2013.01); *H01L 21/048* (2013.01); *H01L 23/544* (2013.01); *H01L 29/66053* (2013.01); *H01L 2223/54426* (2013.01)

(58) Field of Classification Search
CPC . H01L 22/10; H01L 23/544; H01L 21/02378; H01L 21/02529
See application file for complete search history.

(56) References Cited

U.S. PATENT DOCUMENTS

| 6,861,614 B1* | 3/2005 | Tanabe | B23K 26/04 219/121.66 |
|---|---|---|---|
| 7,538,352 B2* | 5/2009 | Fukuda | H01L 21/0445 257/288 |
| 8,012,837 B2* | 9/2011 | Nishio | H01L 29/0878 257/E21.09 |
| 8,679,957 B2* | 3/2014 | Nishio | H01L 21/02658 257/E21.057 |
| 8,863,685 B2* | 10/2014 | Mori | B28B 11/007 118/317 |
| 2004/0242022 A1* | 12/2004 | Kosugi | H01L 29/66068 438/779 |
| 2006/0108589 A1* | 5/2006 | Fukuda | H01L 21/0455 257/77 |
| 2012/0244307 A1* | 9/2012 | Hori | H01L 21/0475 428/56 |

(Continued)

FOREIGN PATENT DOCUMENTS

| JP | 2009-170558 A | 7/2009 |
|---|---|---|
| JP | 2011-100928 A | 5/2011 |
| JP | 2013-065650 A | 4/2013 |

(Continued)

*Primary Examiner* — Laura Menz
(74) *Attorney, Agent, or Firm* — Venable LLP; Michael A. Sartori

(57) ABSTRACT

A silicon carbide substrate having a main surface angled off in an off direction relative to a {0001} plane is prepared. A protruding first alignment mark is formed on the main surface of the silicon carbide substrate. A second alignment mark is formed on the first alignment mark by forming a silicon carbide epitaxial layer on the first alignment mark. The first alignment mark includes a first region and a second region, the second region being in contact with the first region and extending from the first region in the off direction. The second alignment mark includes a first portion formed on the first region and a second portion formed on the second region. An alignment step includes the step of capturing an image of the first portion while not including the second portion, and recognizing an edge of the first portion based on the image.

12 Claims, 28 Drawing Sheets

(56) References Cited

U.S. PATENT DOCUMENTS

| | | | |
|---|---|---|---|
| 2013/0237042 A1* | 9/2013 | Nishio | H01L 21/02658 438/499 |
| 2013/0243952 A1* | 9/2013 | Mori | B28B 11/007 427/230 |
| 2014/0240952 A1* | 8/2014 | Nakanishi | F21K 9/90 362/19 |
| 2015/0111368 A1* | 4/2015 | Tsuji | C30B 25/20 438/478 |

FOREIGN PATENT DOCUMENTS

| | | | |
|---|---|---|---|
| JP | 2013232565 A | * 11/2013 | |
| WO | WO 2013161450 A1 | * 10/2013 | C30B 25/20 |
| WO | WO 2014199749 A1 | * 12/2014 | H01L 29/78 |
| WO | WO 2015015937 A1 | * 2/2015 | H01L 21/3065 |

* cited by examiner

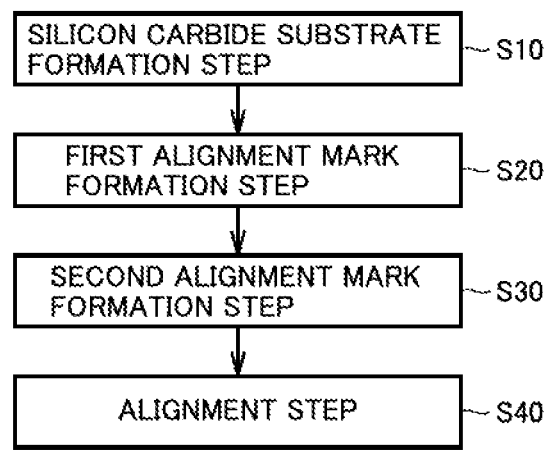
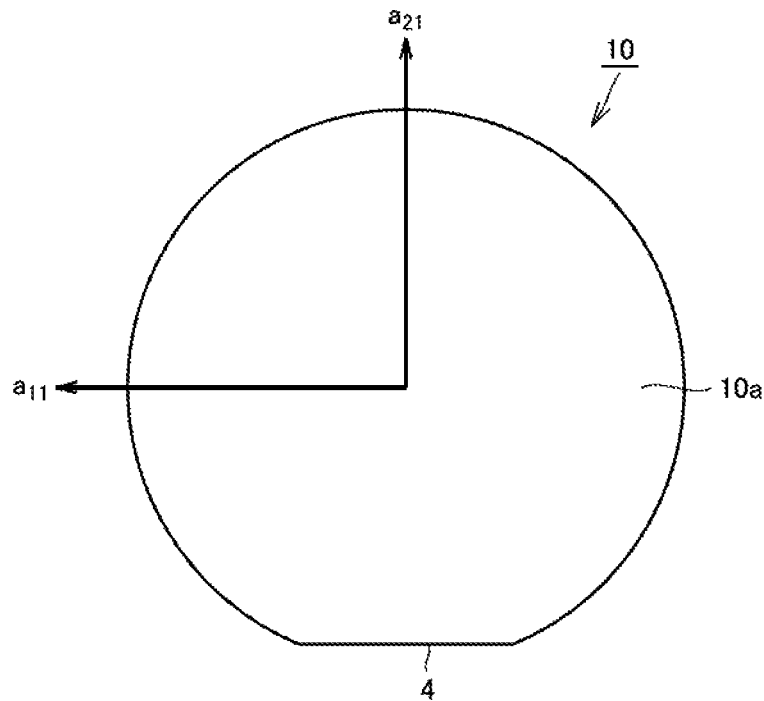

METHOD OF MANUFACTURING SILICON CARBIDE SEMICONDUCTOR DEVICE

BACKGROUND OF THE INVENTION

1. Field of the Invention

The present invention relates to methods of manufacturing silicon carbide semiconductor devices.

2. Description of the Background Art

In recent years, silicon carbide has been increasingly employed as a material for a semiconductor device in order to allow a higher breakdown voltage, lower loss and the use in a high-temperature environment and the like of the semiconductor device. Silicon carbide is a wide band gap semiconductor having a band gap wider than that of silicon which has been conventionally and widely used as a material for a semiconductor device. By employing the silicon carbide as a material for a semiconductor device, therefore, a higher breakdown voltage, lower on-resistance and the like of the semiconductor device can be achieved. A semiconductor device made of silicon carbide also has the advantage of exhibiting less performance degradation when used in a high-temperature environment than a semiconductor device made of silicon.

For example, Japanese Patent Laying-Open No. 2011-100928, Japanese Patent Laying-Open No. 2013-65650 and Japanese Patent Laying-Open No. 2009-170558 describe semiconductor devices made of silicon carbide.

SUMMARY OF THE INVENTION

A method of manufacturing a silicon carbide semiconductor device according to one embodiment of the present invention includes the following steps. A silicon carbide substrate having a main surface angled off relative to a {0001} plane is prepared. A protruding first alignment mark is formed on the main surface of the silicon carbide substrate. A second alignment mark is formed on the first alignment mark by forming a silicon carbide epitaxial layer on the first alignment mark. Alignment of the silicon carbide substrate is performed using the second alignment mark. The first alignment mark includes a first region and a second region, the second region being in contact with the first region and extending from the first region in an off direction in which a <0001> direction is projected onto the main surface. The first region includes a short side along a direction parallel to the off direction, and a long side along a direction perpendicular to the off direction within the main surface. The second alignment mark includes a first portion formed on the first region and a second portion formed on the second region. The step of performing alignment includes the step of capturing an image of the first portion while not including the second portion, and recognizing an edge of the first portion based on the image.

Objects, features, aspects and advantages of the present invention will become apparent from the following detailed description of the present invention when taken in conjunction with the accompanying drawings.

BRIEF DESCRIPTION OF THE DRAWINGS

FIG. 4 is a flow diagram schematically showing a method of manufacturing the silicon carbide semiconductor device according to one embodiment of the present invention.

FIG. 5 is a schematic plan view schematically showing a first step of the method of manufacturing the silicon carbide semiconductor device according to one embodiment of the present invention.

DETAILED DESCRIPTION OF THE INVENTION

Description of Embodiments of the Present Invention

First, embodiments of the present invention will be described in list form.

Generally, alignment is performed so as to reduce relative misalignment between a plurality of different steps. When a silicon substrate is used, for example, a protecting film made of silicon dioxide is formed on the silicon substrate, and then the silicon dioxide film can be processed to form an alignment mark. When a silicon carbide substrate is used, however, high-temperature treatment at 1700° C. or higher, for example, needs to be performed in a semiconductor fabrication process. For this reason, silicon dioxide cannot be processed to form an alignment mark, and silicon carbide needs to be directly processed to form an alignment mark. Methods of recognizing an alignment mark include an LSA (Laser Step Alignment) method and an FIA (Field Image Alignment) method. The LSA method is an optical alignment method of performing alignment by applying a laser to an alignment mark and analyzing reflected light of the laser. The FIA method is an image recognition method of performing alignment by recognizing the edge of an image captured by a camera.

To perform epitaxial growth of high quality, a silicon carbide substrate having a main surface angled off relative to a {0001} plane may be used. When a silicon carbide epitaxial layer is formed on the main surface of the silicon carbide substrate angled off relative to the {0001} plane, the silicon carbide epitaxial layer is grown asymmetrically with respect to the normal of the main surface as a result of step-flow growth. Thus, when a protruding first alignment mark having a symmetrical shape with respect to the normal of the main surface of the silicon carbide substrate is formed on the main surface, and then a silicon carbide epitaxial layer is formed on the first alignment mark by epitaxial growth, for example, a second alignment mark formed on the first alignment mark will have an asymmetrical shape with respect to the normal of the main surface. This results in difficulty in obtaining high alignment accuracy when performing alignment using the second alignment mark by means of a normal method.

The present inventor conducted a detailed study of how to form an alignment mark in a method of manufacturing a silicon carbide semiconductor device, and arrived at the present invention based on the following findings.

Figure 9:
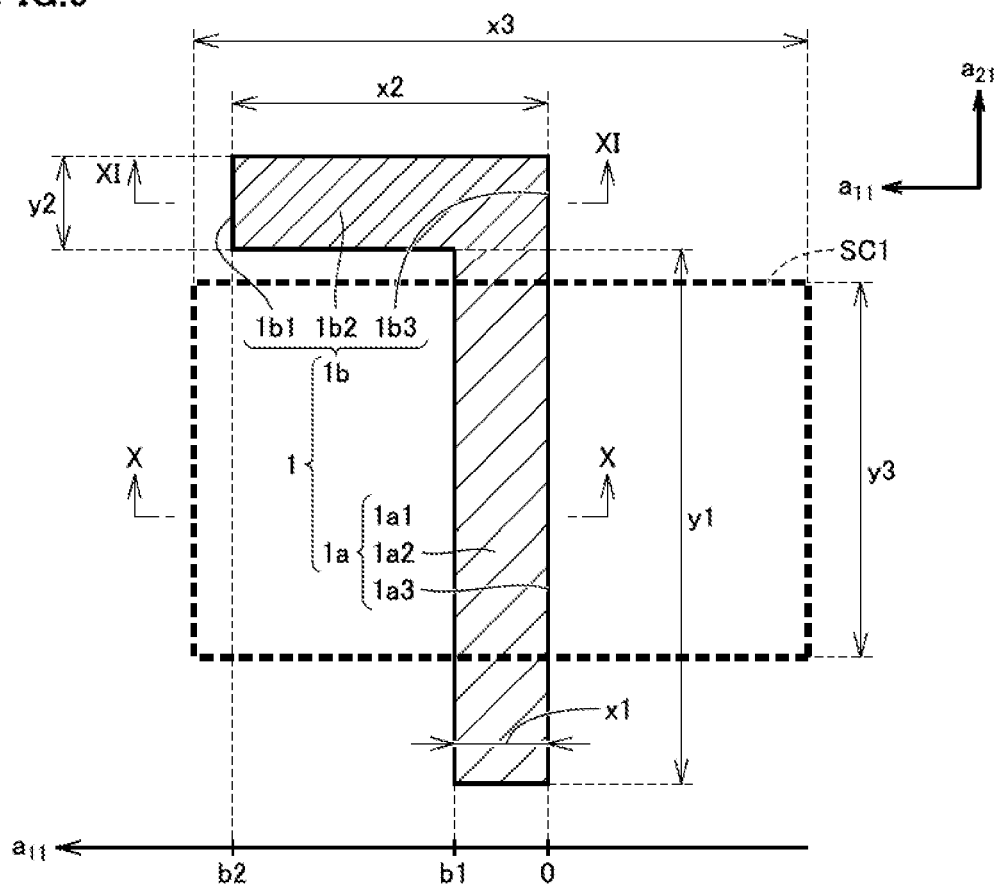
FIG. 9 is a schematic plan view schematically showing the structure of an example of the first alignment mark.
Figure 13:
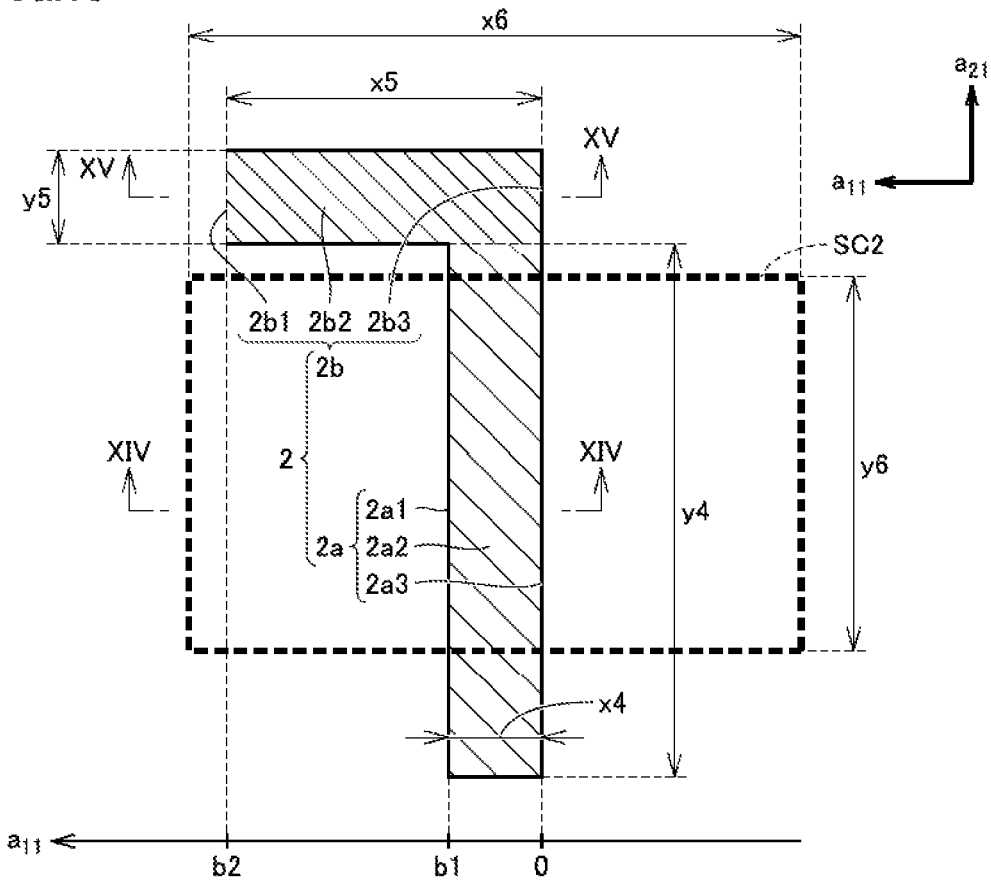
FIG. 13 is a schematic plan view schematically showing the structure of an example of a second alignment mark.
Figure 14:
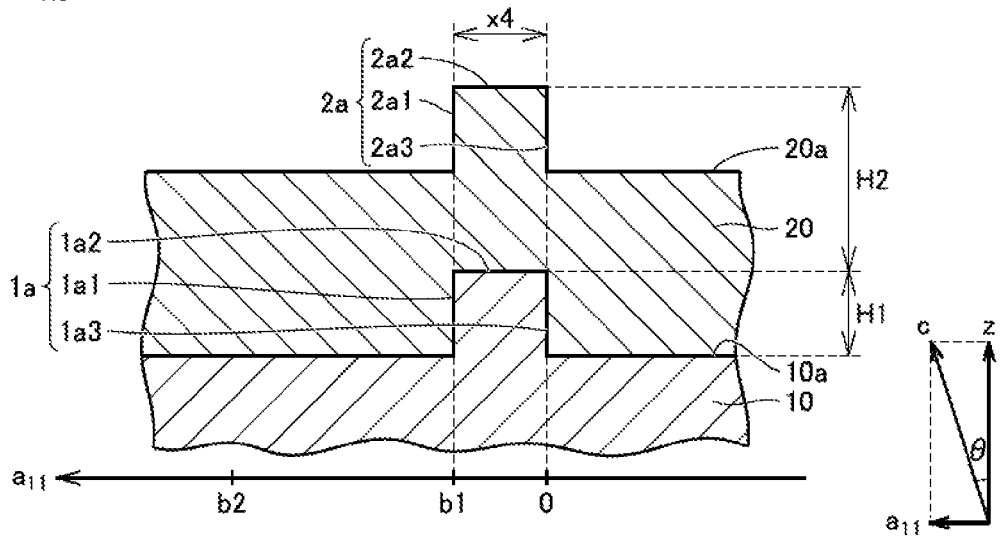
FIG. 14 is a schematic sectional view of a region taken along XIV-XIV in FIG. 13.
Figure 15:
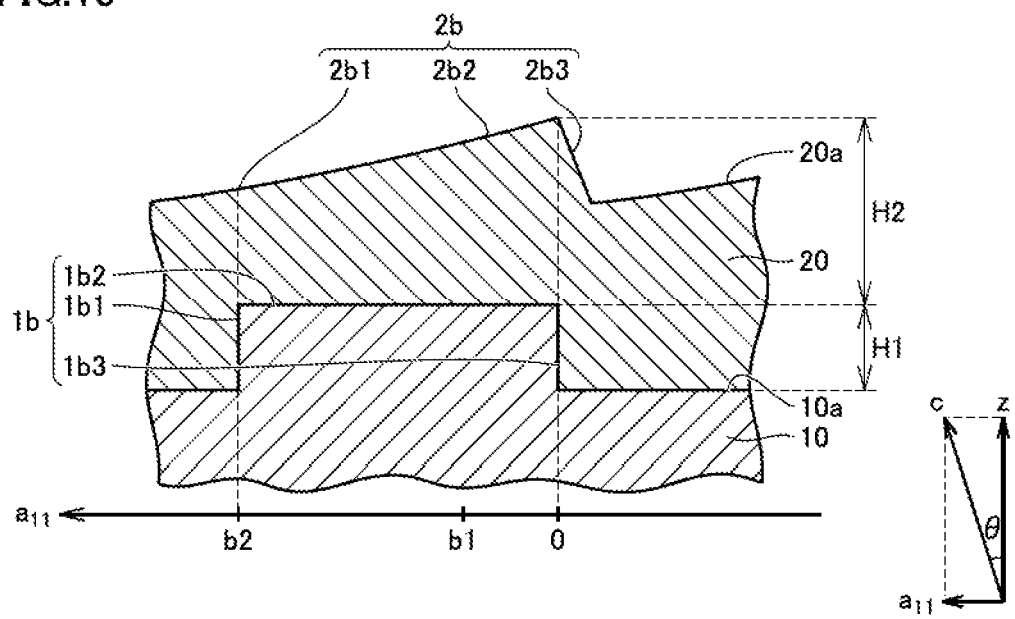
FIG. 15 is a schematic sectional view of a region taken along XV-XV in FIG. 13.
Figure 40:
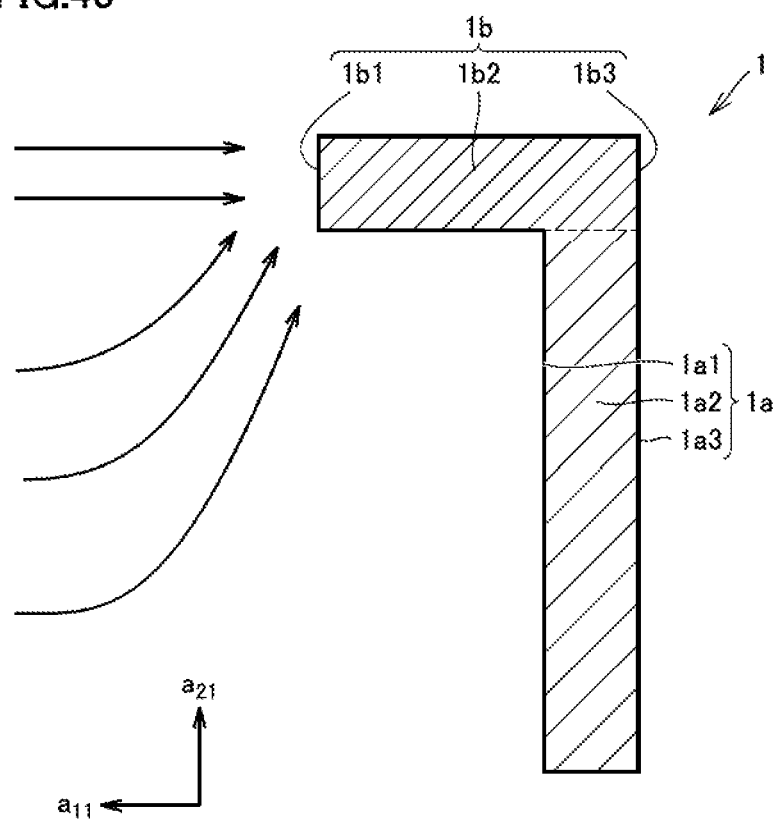
FIG. 40 is a diagram schematically showing a state where silicon carbide is collected at an end portion of a second region of the first alignment mark.

First, a first alignment mark 1 is formed on a main surface of a silicon carbide substrate 10. Referring to FIG. 9, first alignment mark 1 includes a first region 1a extending in a direction a21 substantially perpendicular to an off direction a11 of the main surface, and a second region 1b extending from first region 1a in off direction a11 of the main surface. Referring to FIG. 40, when a silicon carbide epitaxial layer is formed on thus shaped first alignment mark 1 by epitaxial growth, the silicon carbide is collected and grown at an end portion 1b1 of second region 1b facing off direction a11. As indicated with arrows in FIG. 40, the silicon carbide is collected and grown at end portion 1b1 of second region 1b not only from a direction facing end portion 1b of second region 1b facing off direction a11, but also from a direction facing an end portion 1a1 of first region 1a facing off direction a11. Consequently, as shown in FIG. 15, a silicon carbide epitaxial layer formed on end portion 1b1 of second region 1b will be inclined relative to a main surface 10a of silicon carbide substrate 10. On the other hand, as shown in FIG. 14, the silicon carbide epitaxial layer formed on end portion 1a1 of first region 1a facing off direction a11 will be substantially perpendicular to main surface 10a of silicon carbide substrate 10. The silicon carbide epitaxial layer formed on an end portion 1a3 of first region 1a facing opposite to off direction a11 will also be substantially perpendicular to main surface 10a of silicon carbide substrate 10. That is, it is difficult to clearly identify an end portion 2b1 facing off direction a11 of a portion (second portion 2b) included in a second alignment mark 2 and formed on second region 1b (see FIG. 15), whereas an end portion 2a1 facing off direction a11 of a portion (first portion 2a) included in second alignment mark 2 and formed on first region 1a can be clearly identified (see FIG. 14). Thus, by capturing an image of first portion 2a while not including second portion 2b and recognizing an edge of first portion 2a based on the image in an alignment step using second alignment mark 2, alignment of silicon carbide substrate 10 having the main surface angled off relative to the {0001} plane can be performed with high accuracy (see FIG. 13).

(1) A method of manufacturing a silicon carbide semiconductor device according to one embodiment of the present invention includes the following steps. A silicon carbide substrate 10 having a main surface 10a angled off relative to a {0001} plane is prepared. A protruding first alignment mark 1 is formed on main surface 10a of silicon carbide substrate 10. A second alignment mark 2 is formed on first alignment mark 1 by forming a silicon carbide epitaxial layer 20 on first alignment mark 1. Alignment of silicon carbide substrate 10 is performed using second alignment mark 2. First alignment mark 1 includes a first region 1a and a second region 1b, second region 1b being in contact with first region 1a and extending from first region 1a in an off direction a11 in which a <0001> direction is projected onto main surface 10a. First region 1a includes a short side along a direction parallel to off direction a11, and a long side along a direction perpendicular to off direction a11 within main surface 10a. Second alignment mark 2 includes a first portion 2a formed on first region 1a and a second portion 2b formed on second region 1b. The step of performing alignment includes the step of capturing an image of first portion 2a while not including second portion 2b, and recognizing an edge of first portion 2a based on the image. Consequently, the alignment accuracy of silicon carbide substrate 10 can be improved.

(2) Preferably, in the method of manufacturing a silicon carbide semiconductor device according to (1) above, second region 2b is in contact with one end portion of first region 1a in direction a21 perpendicular to off direction a11 within main surface 10b. Consequently, the image-captured region for the alignment can be increased to thereby further improve the alignment accuracy.

(3) Preferably, in the method of manufacturing a silicon carbide semiconductor device according to (1) or (2) above, assuming that a width of second region 1b along off direction a11 is x, and a width of first region 1a along direction a21 perpendicular to off direction a11 within main surface 10a is y, x is not less than y/3 and not more than 2y. Consequently, the silicon carbide can be efficiently grown at an end portion of second region 1b, thereby further improving the alignment accuracy.

(4) Preferably, in the method of manufacturing a silicon carbide semiconductor device according to any of (1) and (3) above, second region 1b is inclined from off direction a11 toward first region 1a. Consequently, an end portion of first region 1a in off direction a11 can be protected by second region 1b. As a result, the edge of first portion 2a of second alignment mark 2 facing off direction a11 becomes steeper, thereby improving the alignment accuracy.

(5) Preferably, in the method of manufacturing a silicon carbide semiconductor device according to (4) above, second region 1b includes a one side second region portion 1b4 in contact with one end portion of first region 1a in direction a21 perpendicular to off direction a11 within main surface 10a, and an other side second region portion 1b5 in contact with the other end portion. Consequently, the silicon carbide can be grown at the end portion of each of one side second region portion 1b4 and other side second region portion 1b5, thereby further improving the alignment accuracy.

(6) Preferably, in the method of manufacturing a silicon carbide semiconductor device according to (5) above, assuming that a width of each of one side second region portion 1b4 and other side second region portion 1b5 along off direction a11 is x, and a width of first region 1a along the direction perpendicular to the off direction within the main surface is y, x is not less than y/6 and not more than 3y. Consequently, the silicon carbide can be efficiently grown at the end portion of each of one side second region portion 1b4 and other side second region portion 1b5, thereby further improving the alignment accuracy.

(7) Preferably, in the method of manufacturing a silicon carbide semiconductor device according to any of (1) and (6) above, first region 1a has a rectangular shape when viewed from a normal direction of main surface 10a. Consequently, the alignment mark can be suitably used for an alignment method using a rectangular alignment mark.

(8) Preferably, in the method of manufacturing a silicon carbide semiconductor device according to any of (1) and (6) above, first region 1a has a cross shape when viewed from a normal direction of main surface 10a. Consequently, the alignment mark can be suitably used for an alignment method using a cross-shaped alignment mark.

(9) Preferably, in the method of manufacturing a silicon carbide semiconductor device according to any of (1) and (8) above, a height H1 of first alignment mark 1 along a normal direction of main surface 10a is 0.2 times or more of a thickness 112 of the silicon carbide epitaxial layer along the normal direction of main surface 10a. Consequently, the second alignment mark with a sufficient level difference can be formed, thereby effectively improving the alignment accuracy.

(10) Preferably, in the method of manufacturing a silicon carbide semiconductor device according to any of (1) and (9) above, in the step of forming first alignment mark 1, first alignment mark 1 is formed on a dicing line 3 on main surface 10a. By forming first alignment mark 1 on dicing line 3, the alignment accuracy can be improved without reducing the area where a semiconductor element is formed.

(11) Preferably, the method of manufacturing a silicon carbide semiconductor device according to any of (1) and (10) above further includes the step of forming a first impurity region 71 within silicon carbide substrate 10 after the step of preparing silicon carbide substrate 10. Consequently, the silicon carbide semiconductor device including first impurity region 71 can be obtained.

(12) Preferably, the method of manufacturing a silicon carbide semiconductor device according to any of (1) and (11) above further includes the step of forming at least one of a second impurity region 84 and an electrode 94 in silicon carbide epitaxial layer 20 after the step of performing alignment. Consequently, the alignment accuracy can be improved in the step of forming at least one of second impurity region 84 and electrode 94.

Details of Embodiments of the Present Invention

Embodiments of the present invention will be described below with reference to the drawings. In the following drawings, the same or corresponding parts have the same reference numbers allotted and description thereof will not be repeated. Regarding crystallographic denotation herein, an individual orientation, a group orientation, an individual plane, and a group plane are shown in [ ], < >, ( ), and { }, respectively. Although a crystallographically negative index is normally expressed by a number with a bar "-" thereabove, a negative sign herein precedes a number to indicate a crystallographically negative index.

First, the structure of a MOSFET 100 as a silicon carbide semiconductor device according to one embodiment of the present invention will be described.

MOSFET 100 according to this embodiment mainly includes a silicon carbide layer 101, a gate oxide film 91, a gate electrode 92, an interlayer insulating film 93, a source electrode 94, a source wire layer 95, and a drain electrode 98. Silicon carbide layer 101 mainly includes a silicon carbide substrate 10 and a silicon carbide epitaxial layer 20. Silicon carbide substrate 10 includes a silicon carbide single-crystal substrate 80, a first drift region 81a, and a relaxing region 71. Silicon carbide single-crystal substrate 80 has a hexagonal crystal structure of polytype 4H, for example. Silicon carbide epitaxial layer 20 includes a second drift region 81b, a base region 82, a source region 83, and a contact region 84.

First drift region 81a and second drift region 81b each include an n type impurity (donor) such as nitrogen, and has n type conductivity (first conductivity type). An impurity concentration in each of first drift region 81a and second drift region 81b is preferably lower than an impurity concentration in silicon carbide single-crystal substrate 80. The donor concentration in each of first drift region 81a and second drift region 81b is preferably not less than $1\times10^{15}$ cm$^{-3}$ and not more than $5\times10^{16}$ cm$^{-3}$ and is $8\times10^{15}$ cm$^{-3}$, for example. First drift region 81a and second drift region 81b form a drift region.

Base region 82 includes a p type impurity (acceptor) such as aluminum, and has p type conductivity (second conductivity type). Base region 82 is provided on second drift region 81b. An acceptor concentration in base region 82 is $1\times10^{18}$ cm$^{-3}$, for example. Source region 83 includes an n type impurity such as phosphorus, and has n type conductivity. Source region 83 is provided on base region 82 so as to be separated from second drift region 81b by base region 82. Source region 83 forms, together with contact region 84, an upper surface P2 of silicon carbide layer 101. Contact region 84 includes a p type impurity such as aluminum, and has p type conductivity. Contact region 84 is provided through source region 83 to connect upper surface P2 with base region 82.

Upper surface P2 of silicon carbide layer 101 is provided with a trench TR. Trench TR includes a sidewall portion SW and a bottom portion BT. Sidewall portion SW extends through source region 83 and base region 82 to reach second drift region 81b. Sidewall portion SW includes a channel surface of MOSFET 100 on base region 82. Sidewall portion SW is inclined relative to upper surface P2 of silicon carbide layer 101, so that trench TR is tapered to expand toward the opening. A plane orientation of sidewall portion SW is preferably inclined at not less than 50° and not more than 70° relative to a {0001} plane, and more preferably inclined at not less than 500 and not more than 70 relative to a (000-1) plane.

Figure 2:
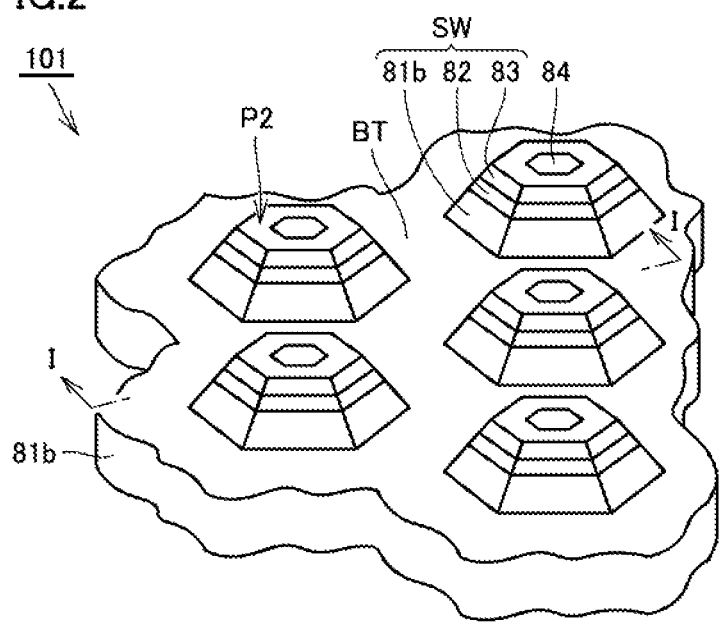
FIG. 2 is a schematic perspective view schematically showing the structure of a silicon carbide layer of the silicon carbide semiconductor device according to one embodiment of the present invention.
Figure 3:
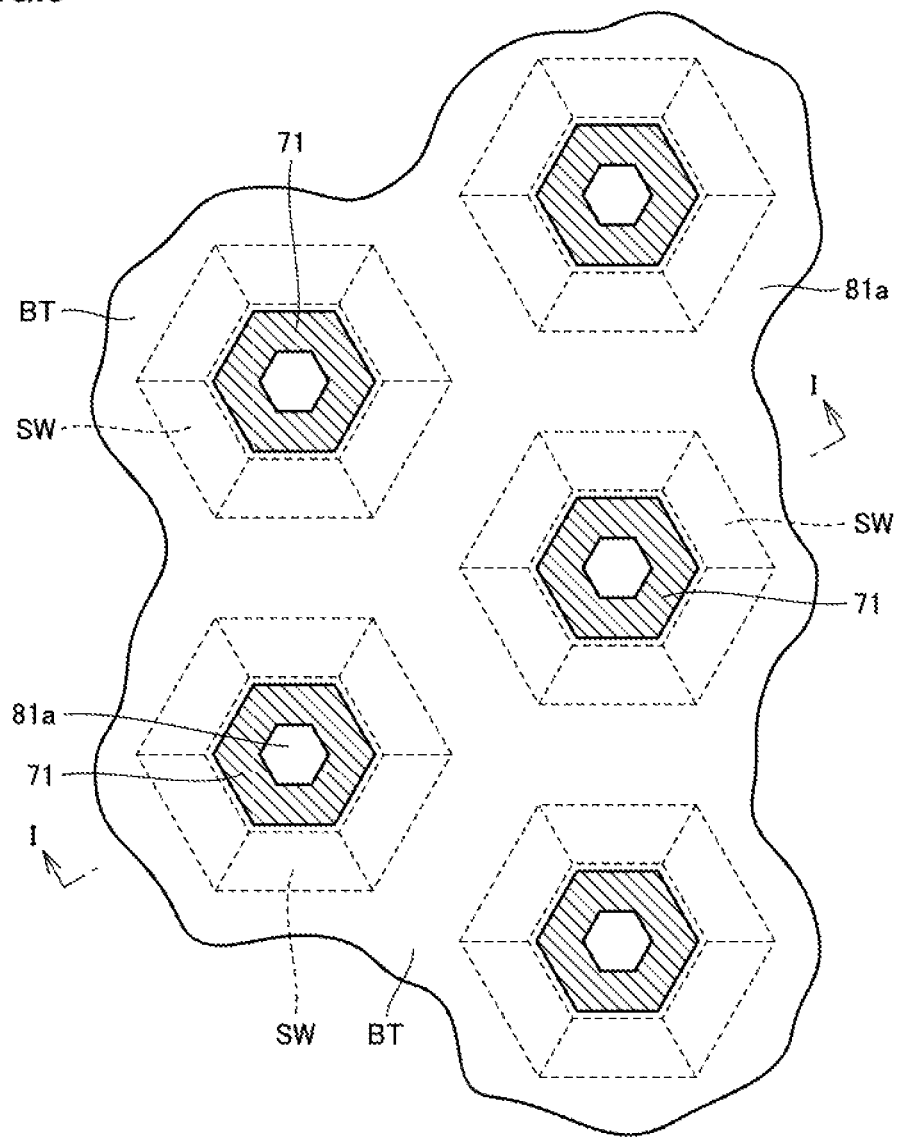
FIG. 3 is a schematic plan view of a region taken along III-III in FIG. 1.

Bottom portion BT of trench TR is located on second drift region 81b. In this embodiment, bottom portion BT has a flat shape substantially parallel to upper surface P2. A portion where bottom portion BT and sidewall portion SW are connected together form a corner portion of trench TR. Referring to FIGS. 2 and 3, trench TR extends to form a mesh having a honeycomb structure in plan view (viewed along a direction perpendicular to a first main surface 10a). Thus, silicon carbide layer 101 has hexagonal upper surface P2 surrounded by trench TR. Contact region 84, source region 83 and base region 82 each have a hexagonal contour, for example, in plan view.

Figure 1:
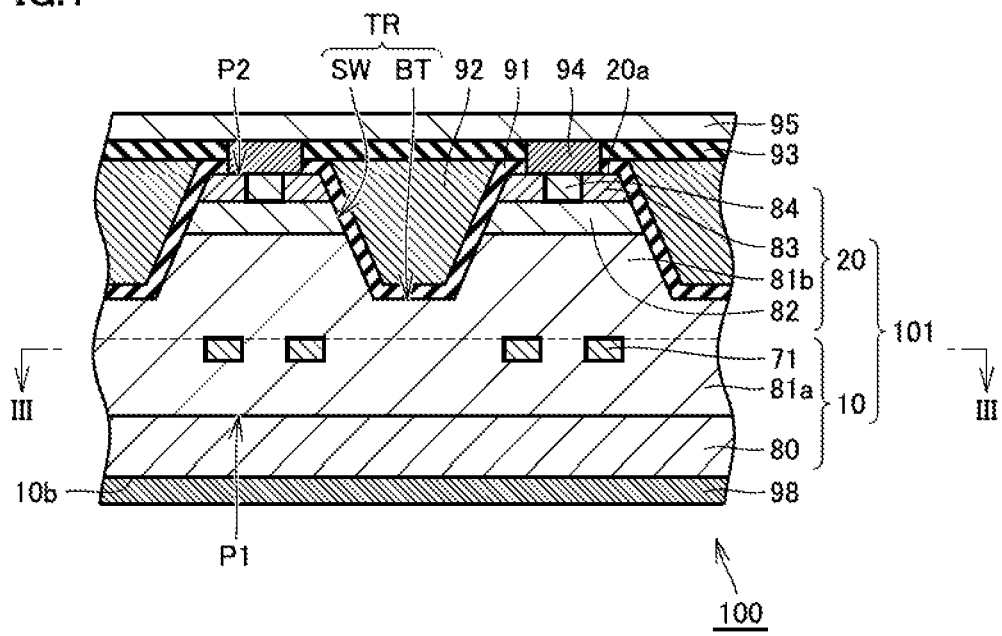
FIG. 1 is a schematic sectional view schematically showing the structure of a silicon carbide semiconductor device according to one embodiment of the present invention.

Relaxing region 71 includes a p type impurity such as aluminum, and has p type conductivity. Relaxing region 71 is provided to be interposed between first drift region 81a and second drift region 81b. Relaxing region 71 is separated from base region 82 by second drift region 81b Relaxing region 71 is also at a distance from sidewall portion SW and bottom portion BT of trench TR. A dose of relaxing region 71 is preferably not less than $1\times10^{12}$ cm$^{-2}$ and not more than $1\times10^{15}$ cm$^{-2}$, and is $1\times10^{13}$ cm$^{-2}$, for example. Relaxing region 71 is provided, for example, in a position deeper than the position of bottom portion BT of trench TR. Referring to FIGS. 1 and 3, relaxing region 71 is provided, for example, to face base region 82. Relaxing region 71 has an annular shape to surround first drift region 81a, for example, in plan view. Relaxing region 71 has a hexagonal contour, for example, in plan view. Relaxing region 71 may be provided in a position facing sidewall portion SW of trench TR, or may be provided in a position facing bottom portion BT of trench TR. Relaxing region 71 relaxes electric field concentration in the corner portion of trench TR.

Gate oxide film 91 covers sidewall portion SW and bottom portion BT of trench TR. Gate electrode 92 is provided on gate oxide film 91. Source electrode 94 is in contact with source region 83 and contact region 84. Source wire layer 95 is in contact with source electrode 94. Source wire layer 95 is a layer including aluminum, for example. Interlayer insulating film 93 insulates gate electrode 92 and source wire layer 95 from each other. Drain electrode 98 is provided in contact with a second main surface 10b of silicon carbide substrate 10.

Referring now to FIGS. 4 to 40, a method of manufacturing MOSFET 100 as a silicon carbide semiconductor device according to this embodiment will be described.

First, a silicon carbide substrate formation step (S10: FIG. 4) is performed. Specifically, an ingot made of hexagonal silicon carbide of polytype 4H, for example, is sliced to prepare silicon carbide single-crystal substrate 80. Then, first drift region 81a made of silicon carbide is formed by epitaxial growth on silicon carbide single-crystal substrate 80. This epitaxial growth can be performed by means of a CVD (Chemical Vapor Deposition) method using a mixed gas of silane (SiH$_4$) and propane (C$_3$H$_8$) as a source material gas, for example, and hydrogen gas (H$_2$) as a carrier gas, for example. On this occasion, nitrogen is introduced, for example, as an impurity. Silicon carbide substrate 10 has n type conductivity (first conductivity type).

Figure 6:
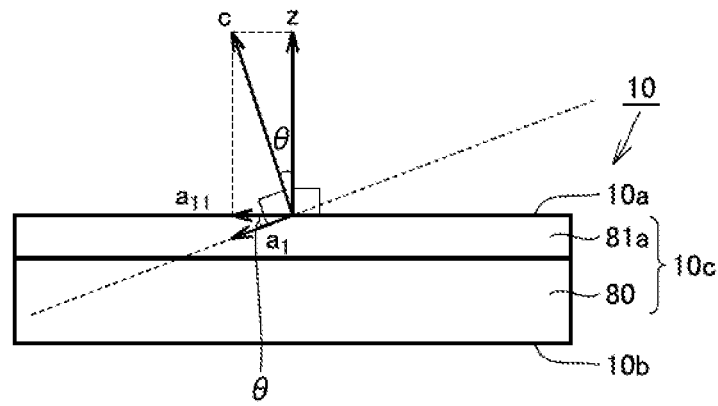
FIG. 6 is a schematic sectional view schematically showing the first step of the method of manufacturing the silicon carbide semiconductor device according to one embodiment of the present invention.

Referring to FIGS. 5 and 6, silicon carbide substrate 10 includes first main surface 10a, and second main surface 10b opposite to first main surface 10a. Silicon carbide substrate 10 includes, for example, silicon carbide single-crystal substrate 80 forming second main surface 10b, and first drift region 81a formed on silicon carbide single-crystal substrate 80 and including silicon carbide epitaxial layer 20 forming first main surface 10a. Silicon carbide substrate 10 may be provided with an orientation flat portion 4.

Referring to FIG. 6, first main surface 10a of silicon carbide substrate 10 is angled at an off angle θ with respect to the {0001} plane (plane indicated with a broken line), for example. The off angle θ is preferably not more than 8°. Specifically, the first main surface is angled off relative to the {0001}plane such that a normal vector z of first main surface 10a includes at least one of components of <1-20> and <1-100>. Preferably, first main surface 10a is angled off relative to the {0001} plane such that normal vector z of first main surface 10a has a component of <1-20>. In FIG. 6, a direction c is a <0001> direction (namely, c axis of hexagonal silicon carbide), and a direction a1 is a <11-20> direction, for example. Off direction a11 is a direction in which the <0001> direction is projected onto first main surface 10a. In the case of FIG. 6, when direction a1 is the <11-20> direction, for example, off direction a11 includes a component of <11-20> direction. Silicon carbide substrate 10 having first main surface 10a angled off relative to the {0001} plane is thus prepared.

Figure 7:
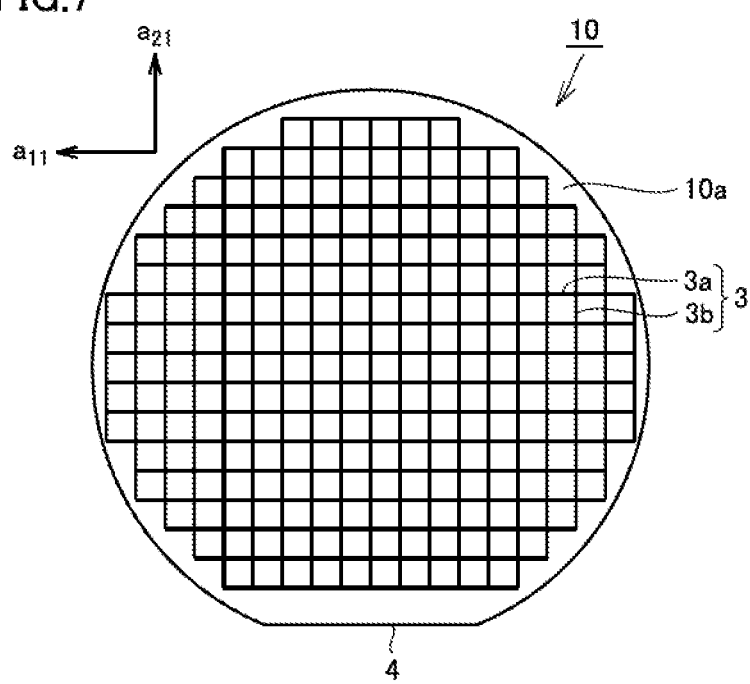
FIG. 7 is a schematic plan view schematically showing the structure of a dicing line.
Figure 8:
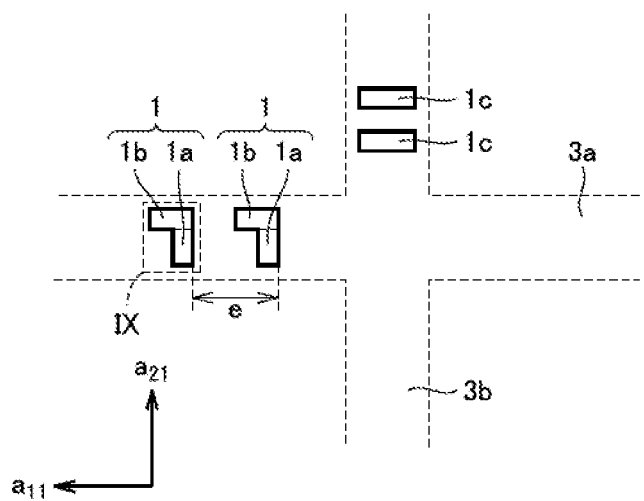
FIG. 8 is a schematic plan view schematically showing the structure of a first alignment mark formed on the dicing line.

Referring to FIG. 7, a dicing line 3 may be formed on first main surface 10a of silicon carbide substrate 10. Dicing line 3 corresponds to a cutting position where silicon carbide substrate 10 with a semiconductor element formed thereon is cut and divided into a plurality of semiconductor chips. In other words, dicing line 3 is a position where the cutting is planned in a dicing step. Dicing line 3 may be a groove. Dicing line 3 includes, for example, first dicing lines 3a extending along off direction a11 parallel to the direction in which orientation flat portion 4 extends, and second dicing lines 3b extending along a direction parallel to a direction a21 perpendicular to off direction a11 within first main surface 10a of silicon carbide substrate 10. Off direction a11 is a direction including a component of <1-20> direction, for example. Direction a21 perpendicular to off direction a11 is a direction including a component of <1-100> direction, for example.

Next, a first alignment mark formation step (S20: FIG. 4) is performed. Specifically, referring to FIG. 8, protruding first alignment mark 1 is formed on main surface 10a of silicon carbide substrate 10, for example. Preferably, first alignment mark 1 is formed on first dicing line 3a on main surface 10a of silicon carbide substrate 10. First alignment mark 1 includes a first region 1a and a second region 1b, second region 1b being in contact with first region 1a and extending from first region 1a in off direction a11 in which the <0001> direction is projected onto main surface 10a. That is, first alignment mark 1 has an L-shape in plan view. A plurality of first alignment marks 1 may be formed along the direction in which first dicing line 3a extends. A third alignment mark 1c may be formed on second dicing line 3b Third alignment mark 1c may have a rectangular shape, for example, in plan view. A longitudinal direction of the rectangular shape may be parallel to the direction in which first dicing line 3a extends. A plurality of third alignment marks 1c may be formed along the direction in which second dicing line 3b extends.

The structure of first alignment mark 1 is now described in detail. Referring to FIG. 9, a width x1 of first region 1a along off direction a11 is smaller than a width y1 of first region 1a along direction a21 perpendicular to off direction a11 within first main surface 10a. Preferably, first region 1a and second region 1b each have a rectangular shape when viewed from the normal direction of first main surface 10a. First region 1a includes a short side along a direction parallel to off direction a11, and a long side along direction a21 perpendicular to off direction a11. Second region 1b includes a long side along a direction parallel to off direction a11, and a short side along direction a21 perpendicular to off direction a11. Preferably, second region 1b is in contact with one end portion of first region 1a in direction a21 perpendicular to off direction a11 within first main surface 10a.

Preferably, assuming that a width of second region 1b along off direction a11 is x2, and a width of first region 1a along direction a21 perpendicular to off direction a11 within first main surface 10a is y1, x2 is not less than y1/3 and not more than 2×y1. When width y1 of first region 1a along direction a21 perpendicular to off direction a11 is 60 µm, for example, width x2 of second region 1b along off direction a11 is not less than 20 µm and not more than 120 µm. Width x1 of first region 1a along off direction a11 is approximately one-tenth of width y1 of first region 1a along direction a21 perpendicular to off direction a11.

Figure 10:
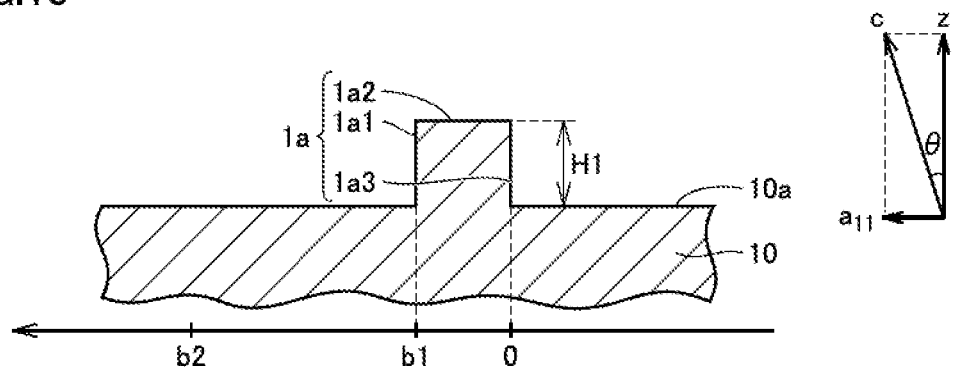
FIG. 10 is a schematic sectional view of a region taken along X-X in FIG. 9.

Referring to FIG. 10, first region 1a of first alignment mark 1 is formed to project from first main surface 10a in sectional view (viewed from a direction parallel to first main surface 10a). First alignment mark 1 may be formed to project from the bottom of first dicing line 3a. A height H1 of first region 1a along the normal direction of first main surface 10a is, for example, not less than 0.6 µm. An end portion 1a1 of first region 1a facing off direction a11 and an end portion 1a3 of first region 1a facing opposite to off direction a11 are formed substantially perpendicular to first main surface 10a. An upper surface 1a2 of first region 1a is substantially parallel to first main surface 10a.

Figure 11:
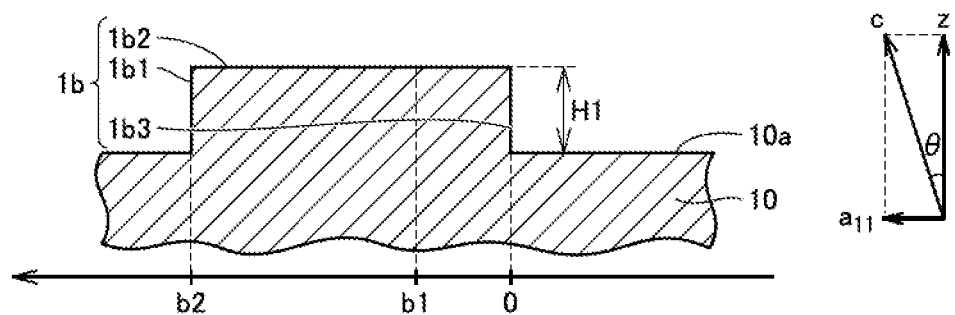
FIG. 11 is a schematic sectional view of a region taken along XI-XI in FIG. 9.

Referring to FIG. 11, second region 1b of first alignment mark 1 is formed to project from first main surface 10a in sectional view. A height H1 of second region 1b along the normal direction of first main surface 10a is, for example, not less than 0.6 µm. An end portion 1b1 of second region 1b facing off direction a11 and an end portion 1b3 of second region 1b facing opposite to off direction a11 are formed substantially perpendicular to first main surface 10a. An upper surface 1b2 of second region 1b is substantially parallel to first main surface 10a.

Figure 12:
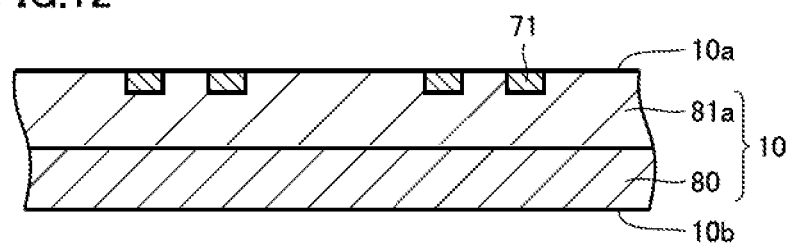
FIG. 12 is a schematic sectional view schematically showing a second step of the method of manufacturing the silicon carbide semiconductor device according to one embodiment of the present invention.

Referring to FIG. 12, relaxing region 71 (first impurity region) being in contact with part of first main surface 10a of first drift region 81a and having p type conductivity (second conductivity type) is formed. Specifically, an implantation mask (not shown) is formed on first main surface 10a of first drift region 81a. Then, alignment of silicon carbide substrate 10 is performed using first alignment mark 1 so as to form an opening over a region where relaxing region 71 is to be formed. Then, the implantation mask is exposed and developed, to form the implantation mask provided with the opening over the region where relaxing region 71 is to be formed. Then, an impurity for providing p type conductivity such as aluminum is implanted using the implantation mask. That is, relaxing region 71 is formed after the alignment of silicon carbide substrate 10 is performed using the first alignment mark and the implantation mask is formed. The implantation mask is removed after relaxing region 71 is formed. Referring to FIG. 9, an image-captured region SC1 in the alignment step using first alignment mark 1 includes first region 1a of first alignment mark 1, and does not include second region 1b. That is, a width x3 of image-captured region SC1 along off direction a11 is greater than width x1 of first region 1a, and a width y3 of image-captured region SC1 along direction a21 perpendicular to off direction a11 is smaller than width y1 of first region 1a.

Next, a step of forming silicon carbide epitaxial layer 20 is performed. After relaxing region 71 is formed in first drift region 81a, silicon carbide epitaxial layer 20 having n type conductivity is formed on first main surface 10a of silicon carbide substrate 10 by epitaxial growth. Silicon carbide epitaxial layer 20 may be formed by means of a method similar to the method of forming first drift region 81a. With silicon carbide epitaxial layer 20 formed on first alignment mark 1, second alignment mark 2 is formed on the surface of silicon carbide epitaxial layer 20.

The structure of second alignment mark 2 is now described. Referring to FIGS. 13 and 14, a first portion 2a of second alignment mark 2 is formed on first region 1a of first alignment mark 1. An end portion 2a1 of first portion 2a of second alignment mark 2 facing off direction a11 and an end portion 2a3 of first portion 2a of second alignment mark 2 facing opposite to off direction a11 are formed substantially perpendicular to a surface 20a of silicon carbide epitaxial layer 20. In other words, end portion 2a1 of first portion 2a of second alignment mark 2 facing off direction a11 is formed on a plane substantially along end portion 1a1 of first region 1a of first alignment mark 1 facing off direction a11. End portion 2a3 of first portion 2a of second alignment mark 2 facing opposite to off direction a11 is formed on a plane substantially along end portion 1a3 of first region 1a of first alignment mark 1 facing opposite to off direction a11. A thickness H2 of silicon carbide epitaxial layer 20 is approximately 3 µm, for example. Preferably, height H1 of first alignment mark 1 along the normal direction of first main surface 10a is 0.2 times or more of thickness H2 of the silicon carbide epitaxial layer along the normal direction of main surface 10a.

Referring to FIGS. 13 and 15, second portion 2b of second alignment mark 2 is formed on second region 1b of first alignment mark 1. As shown in FIG. 40, since first alignment mark 1 has the portion projecting along off direction a11, when forming silicon carbide epitaxial layer 20, the silicon carbide is collected and grown at end portion 1b1 of second region 1b facing off direction a11, as indicated with the arrows. The silicon carbide is collected at end portion 1b1 of second region 1b facing off direction a11 not only from a direction facing end portion 1b1 of second region 1b facing off direction a11, but also from a direction facing end portion 1a1 of first region 1a facing off direction a11. Consequently, second portion 2b of second alignment mark 2 on end portion 1b1 of second region 1b of first alignment mark 1 facing off direction a11 is not provided with an edge, resulting in a smooth surface. An upper surface 2b2 of second portion 2b of second alignment mark 2 forms a surface inclined relative to first main surface 10a of silicon carbide substrate 10 and having a normal substantially parallel to the <0001> direction. An end portion 2b3 of second portion 2b of second alignment mark 2 facing opposite to off direction a11 forms a surface substantially parallel to the <0001> direction. A point of intersection of end portion 2b3 of second portion 2b of second alignment mark 2 facing opposite to off direction a11 and upper surface 2b2 is located on a plane along end portion 1b3 facing opposite to off direction a11 of second region 1b of first alignment mark 1. As described above, second alignment mark 2 is formed on first alignment mark 1 by forming silicon carbide epitaxial layer 20 on first alignment mark 1.

Figure 16:
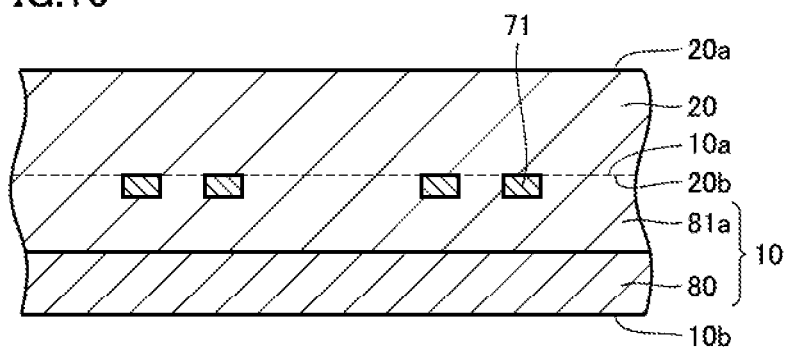
FIG. 16 is a schematic sectional view schematically showing a third step of the method of manufacturing the silicon carbide semiconductor device according to one embodiment of the present invention.

Referring to FIG. 16, silicon carbide epitaxial layer 20 is formed in contact with relaxing region 71 and first drift region 81a. With silicon carbide epitaxial layer 20 formed in contact with first main surface 10a of silicon carbide substrate 10, relaxing region 71 is interposed between first drift region 81a and silicon carbide epitaxial layer 20.

Figure 17:
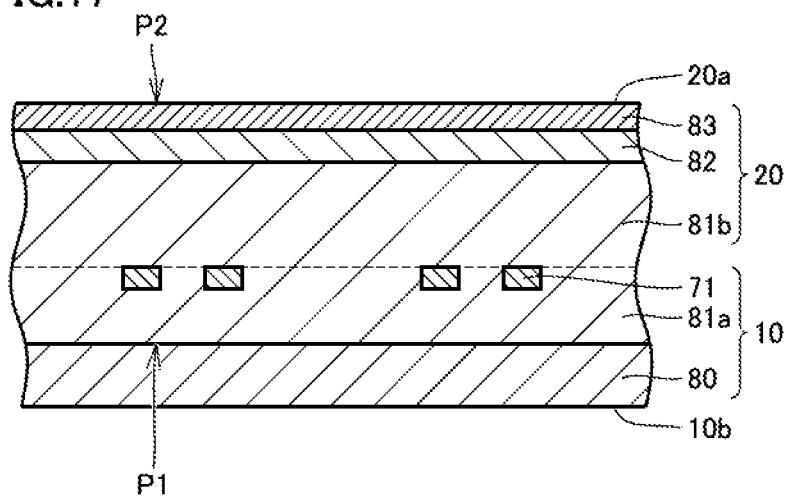
FIG. 17 is a schematic sectional view schematically showing a fourth step of the method of manufacturing the silicon carbide semiconductor device according to one embodiment of the present invention.
Figure 18:
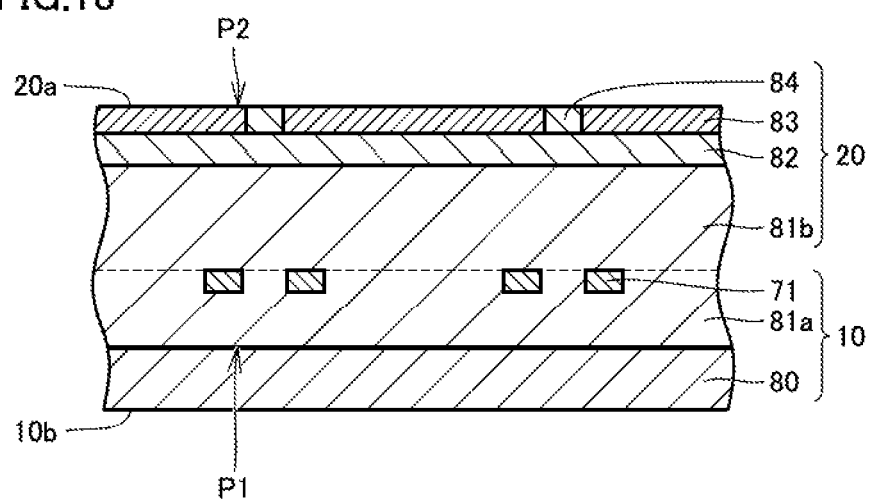
FIG. 18 is a schematic sectional view schematically showing a fifth step of the method of manufacturing the silicon carbide semiconductor device according to one embodiment of the present invention.

Referring to FIG. 17, base region 82 and source region 83 are formed within silicon carbide epitaxial layer 20. P type base region 82 is formed, for example, by ion implantation of a p type impurity for providing p type conductivity such as aluminum into surface 20a of silicon carbide epitaxial layer 20. Then, source region 83 is formed on base region 82, for example, by ion implantation of an n type impurity for providing n type conductivity such as phosphorus into base region 82. Base region 82 and source region 83 may be formed by epitaxial growth that includes the addition of impurities, instead of by the ion implantations described above.

Next, contact region 84 is formed on base region 82. First, an implantation mask (not shown) provided with an opening over a region where contact region 84 is to be formed is provided. The positioning of the opening in the implantation mask can be performed using second alignment mark 2. In other words, alignment of silicon carbide substrate 10 is performed using second alignment mark 2.

Specifically, an image of first portion 2a of second alignment mark 2 is captured. The image of first portion 2a may be captured by a camera including a photoelectric conversion element to recognize the edge of first portion 2a. The edge of first portion 2a refers to, for example, end portion 2a1 of first portion 2a facing off direction a11, and end portion 2a3 of first portion 2a facing opposite to off direction a11 (see FIG. 14). Then, alignment is performed based on the image of first portion 2a of second alignment mark 2. Referring back to FIG. 13, image-captured region SC2 in the alignment step includes first portion 2a of the second alignment mark formed on first region 1a, and does not include second portion 2b of the second alignment mark formed on second region 1b. That is, a width x6 of image-captured region SC2 along off direction a11 is greater than a width x4 of first portion 2a, and a width y6 of image-captured region SC2 along direction a21 perpendicular to off direction a11 is smaller than a width y4 of first portion 2a. Width x6 of image-captured region SC2 along off direction a11 may be smaller than a width x5 of second portion 2b.

After the alignment of silicon carbide substrate 10 is performed, the mask layer is exposed and developed to remove part of the mask layer over the region where contact region 84 is to be formed. Consequently, the implantation mask (not shown) provided with an opening over the region where contact region 84 is to be formed is provided. Then, aluminum ions, for example, are implanted into the surface of silicon carbide epitaxial layer 20 using the implantation mask, to form contact region 84 (second impurity region) in silicon carbide epitaxial layer 20. Then, the implantation mask is removed by means of an arbitrary method such as etching (see FIG. 18).

Next, heat treatment is carried out to activate the impurities. A temperature for this heat treatment is preferably not less than 1500° C. and not more than 1900° C., and is approximately 1700° C., for example. Time of the heat treatment is, for example, approximately 30 minutes. An atmosphere of the heat treatment is preferably an inert gas atmosphere, and is an Ar atmosphere, for example.

Figure 19:
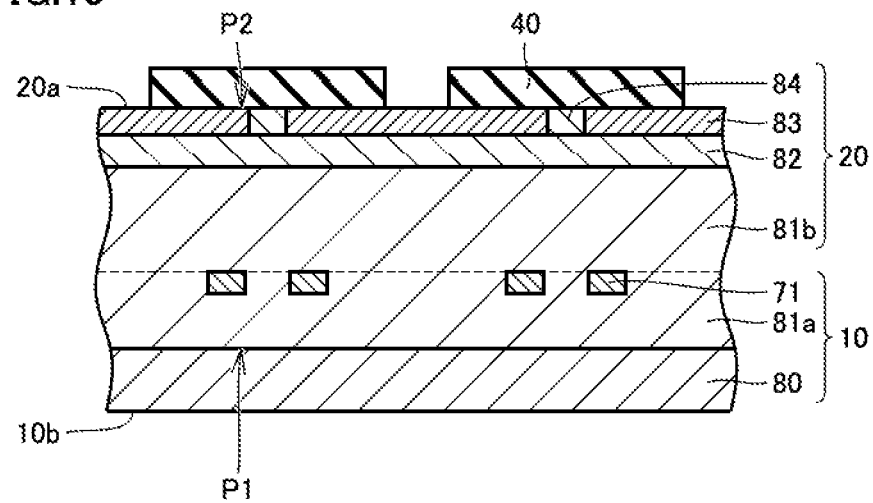
FIG. 19 is a schematic sectional view schematically showing a sixth step of the method of manufacturing the silicon carbide semiconductor device according to one embodiment of the present invention.

As shown in FIG. 19, a mask layer 40 provided with an opening is formed on surface 20a of silicon carbide epitaxial layer 20 formed of source region 83 and contact region 84. A silicon oxide film can be used, for example, as mask layer 40. The opening is formed at a position corresponding to the position of trench TR (see FIG. 21). Mask layer 40 may be formed by performing alignment of silicon carbide substrate 10 such that the position corresponding to the opening is exposed based on first portion 2a of second alignment mark 2 formed on silicon carbide epitaxial layer 20.

Figure 20:
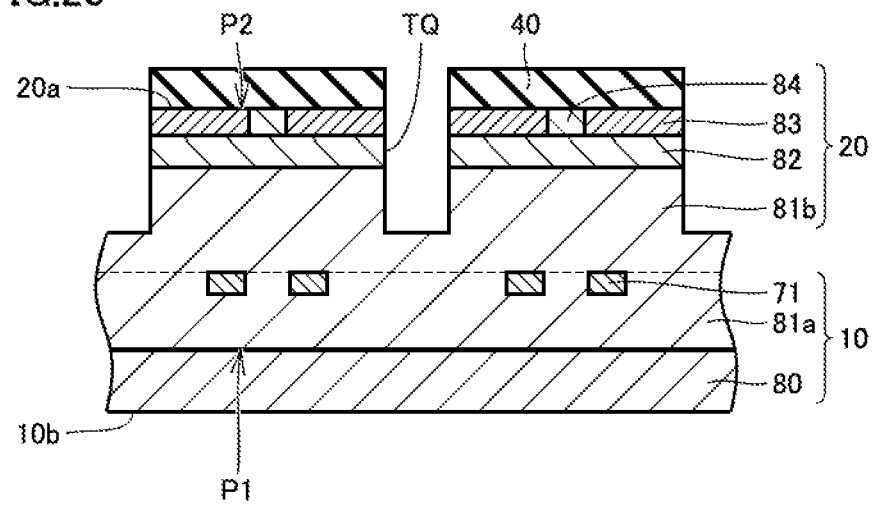
FIG. 20 is a schematic sectional view schematically showing a seventh step of the method of manufacturing the silicon carbide semiconductor device according to one embodiment of the present invention.

As shown in FIG. 20, source region 83, base region 82, and part of second drift region 81b are removed by etching in the opening of mask layer 40. Reactive ion etching (RIE), in particular, inductive coupling plasma (ICP) RIE, can be used as a method for the etching. Specifically, ICP-RIE using $SF_6$ or a mixed gas of $SF_6$ and $O_2$ as a reactive gas can be used, for example. As a result of such etching, a recess TQ having sidewalls substantially perpendicular to surface 20a of silicon carbide epitaxial layer 20 is formed in a region where trench TR (see FIG. 21) is to be formed.

Next, thermal etching is performed in recess TQ. The thermal etching may be performed, for example, by means of heating in an atmosphere including a reactive gas having at least one or more types of halogen atoms. The at least one or more types of halogen atoms include at least one of chlorine (Cl) atoms and fluorine (F) atoms. This atmosphere is, for example, $Cl_2$, $BCL_3$, $SF_6$ or $CF_4$. The thermal etching is performed using a mixed gas of chlorine gas and oxygen gas as a reactive gas, for example, at a heat treatment temperature of not less than 700° C. and not more than 1000° C., for example.

It is noted that the reactive gas may include a carrier gas in addition to the chlorine gas and the oxygen gas described above. For example, nitrogen ($N_2$) gas, argon gas, or helium gas can be used as the carrier gas. When the heat treatment temperature is not less than 700° C. and not more than 1000° C. as described above, an etching rate of silicon carbide is approximately 70 μm/h, for example. In this case, mask layer 40 made of silicon oxide has an extremely high selectivity with respect to silicon carbide, and is thus not substantially etched during the etching of silicon carbide.

Figure 21:
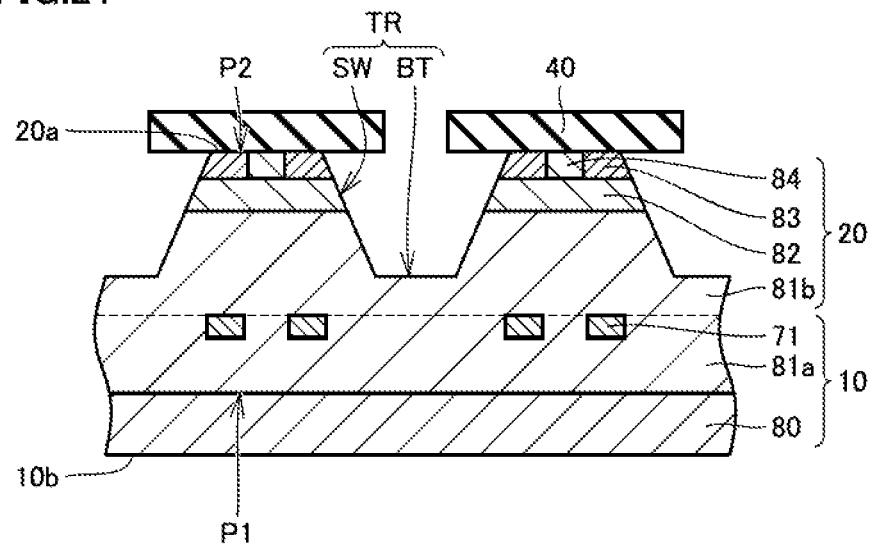
FIG. 21 is a schematic sectional view schematically showing an eighth step of the method of manufacturing the silicon carbide semiconductor device according to one embodiment of the present invention.

As shown in FIG. 21, trench TR is formed in upper surface P2 of silicon carbide layer 101 as a result of the above thermal etching. Trench TR includes sidewall portion SW extending through source region 83 and base region 82 to reach second drift region 81b, and bottom portion BT located on second drift region 81b. Sidewall portion SW and bottom portion BT are at a distance from relaxing region 71. Then, mask layer 40 is removed by means of an arbitrary method such as etching.

Figure 22:
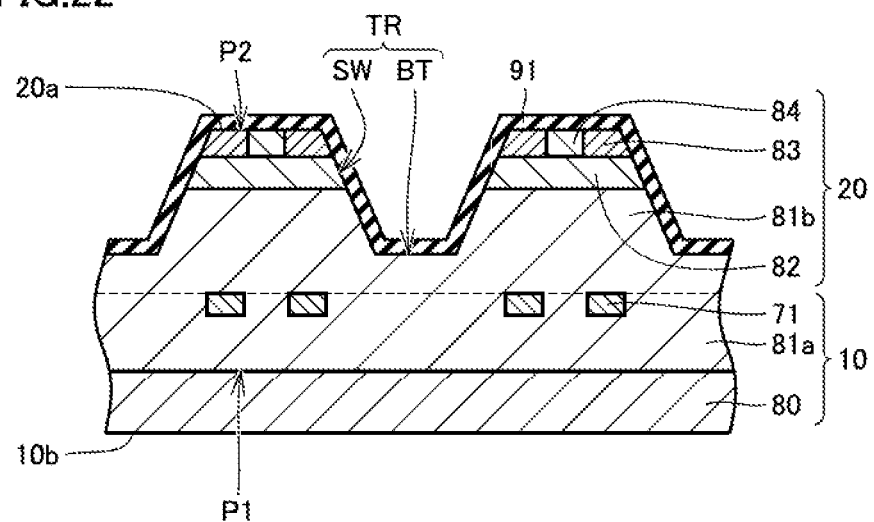
FIG. 22 is a schematic sectional view schematically showing a ninth step of the method of manufacturing the silicon carbide semiconductor device according to one embodiment of the present invention.

Next, gate oxide film 91 is formed to cover sidewall portion SW and bottom portion BT of trench TR (see FIG. 22). Gate oxide film 91 may be formed by thermal oxidation, for example. Then, NO annealing using nitrogen monoxide (NO) gas as an atmospheric gas may be carried out. A temperature profile includes conditions such as a temperature of not less than 1100° C. and not more than 1300° C., and a holding time of approximately one hour. Consequently, nitrogen atoms are introduced into an interface region between gate oxide film 91 and base region 82. As a result, the formation of an interface state in the interface region can be suppressed to thereby improve channel mobility. If such introduction of nitrogen atoms is possible, gas other than the NO gas may be used as the atmospheric gas. After this NO annealing, Ar annealing using argon (Ar) gas as an atmospheric gas may be further carried out.

Figure 23:
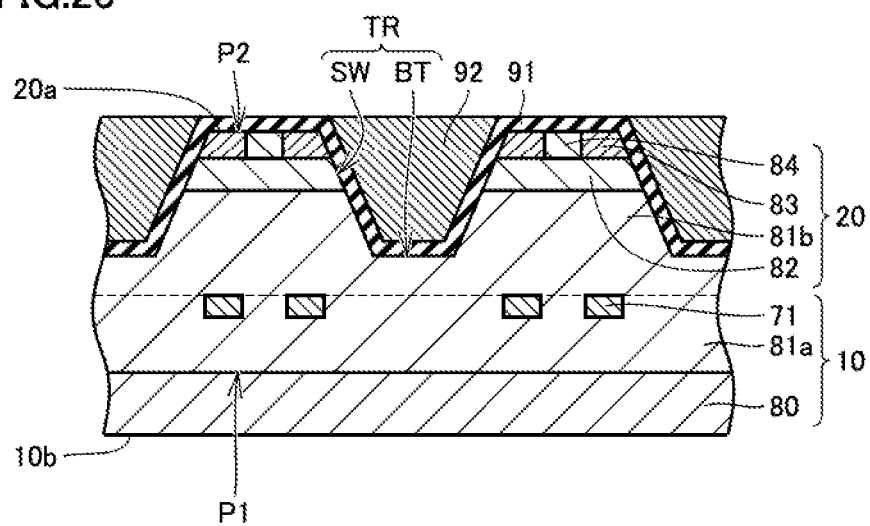
FIG. 23 is a schematic sectional view schematically showing a tenth step of the method of manufacturing the silicon carbide semiconductor device according to one embodiment of the present invention.
Figure 24:
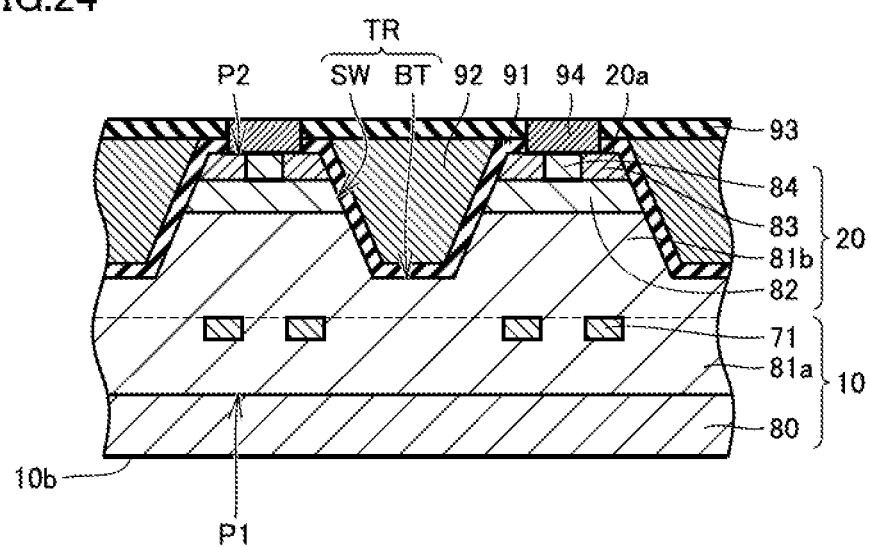
FIG. 24 is a schematic sectional view schematically showing an eleventh step of the method of manufacturing the silicon carbide semiconductor device according to one embodiment of the present invention.

Next, gate electrode 92 is formed on gate oxide film 91. Referring to FIG. 23, specifically, gate electrode 92 is formed on gate oxide film 91 so as to fill a region within trench TR with gate oxide film 91 interposed therebetween. Gate electrode 92 is formed, for example, by depositing a film of a conductor or polysilicon doped with an impurity.

Next, interlayer insulating film 93 is formed on gate electrode 92 and gate oxide film 91 so as to cover an exposed surface of gate electrode 92. Etching is performed so as to form an opening in interlayer insulating film 93 and gate oxide film 91. This opening exposes source region 83 and contact region 84 at upper surface P2. The opening may be formed after alignment is performed based on first portion 2a of second alignment mark 2 formed on silicon carbide epitaxial layer 20, followed by exposure and development steps. Then, source electrode 94 is formed in contact with source region 83 and contact region 84 on upper surface P2 of silicon carbide layer 101 (see FIG. 24). Then, source wire layer 95 is formed in contact with source electrode 94. As described above, after the alignment step, at least one of contact region 84 and source electrode 94 is formed in silicon carbide epitaxial layer 20. Then, on a lower surface P1 formed of first drift region 81a, drain electrode 98 is formed with silicon carbide single-crystal substrate 80 interposed therebetween. The MOSFET shown in FIG. 1 is thus manufactured.

Figure 25:
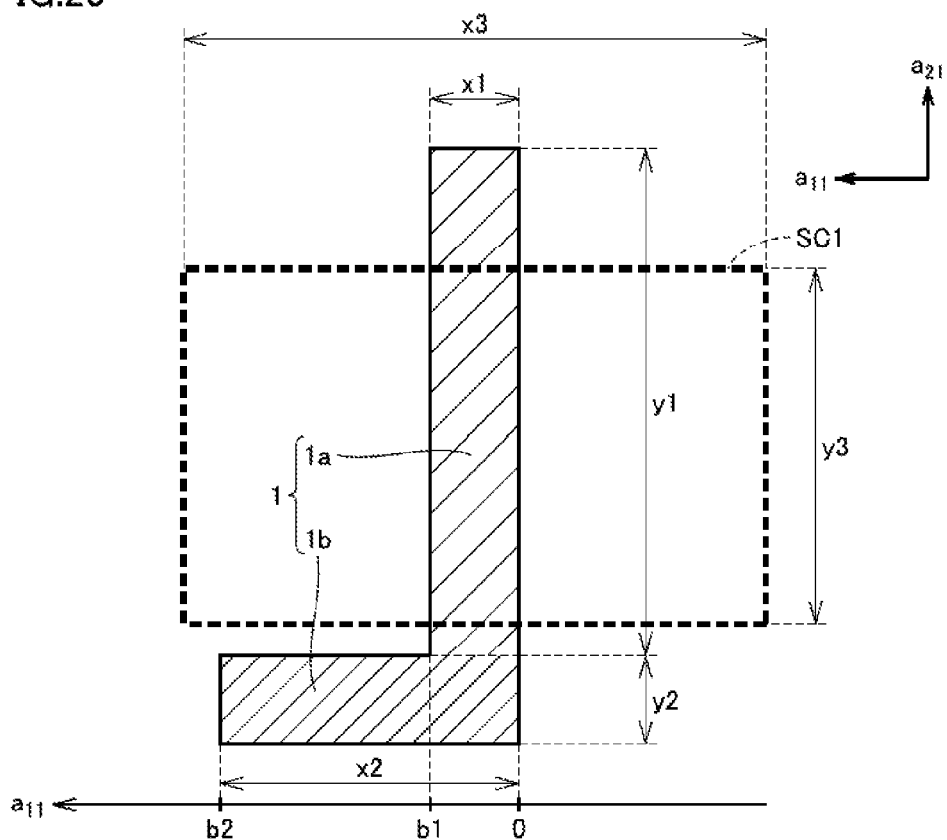
FIG. 25 is a schematic plan view schematically showing the structure of Variation 1 of the first alignment mark.

The structure of Variation 1 of first alignment mark 1 is now described. Referring to FIG. 25, second region 1b may be provided in contact with an end portion of first region 1a facing opposite to direction a21. When direction a21 is a [1-100] direction, for example, the direction opposite to direction a21 is a [-1100] direction. That is, second region 1b may be provided in contact with the end portion of first region 1a facing the [-1100] direction.

Figure 26:
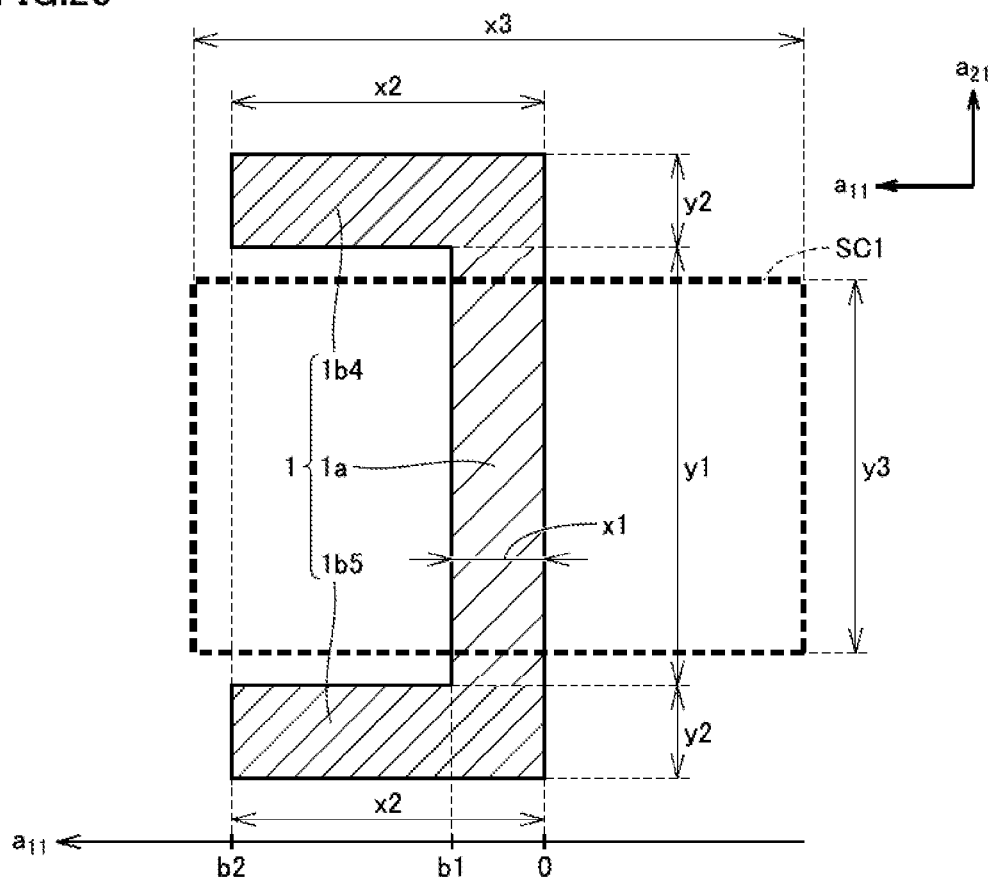
FIG. 26 is a schematic plan view schematically showing the structure of Variation 2 of the first alignment mark.

The structure of Variation 2 of first alignment mark 1 is now described. Referring to FIG. 26, second region 1b may include a one side second region portion 1b4 and an other side second region portion 1b5. One side second region portion 1b4 is in contact with one end portion of first region 1a in direction a21 perpendicular to off direction a11 within first main surface 10a. Other side second region portion 1b5 is in contact with the other end portion of first region 1a in direction a21 perpendicular to off direction a11 within first main surface 10a. When off direction a11 is a [11-20] direction, for example, the one side in direction a21 perpendicular to off direction a11 within first main surface 10a is the [1-100] direction, and the other side is the [-1100] direction.

Preferably, assuming that a width of each of one side second region portion 1b4 and other side second region portion 1b5 along off direction a11 is x, and a width of first region 1a along direction a21 perpendicular to the off direction within first main surface 10a is y, x is not less than y/6 and not more than 3y. When width y1 of first region 1a along direction a21 perpendicular to off direction a11 is 60 μm, for example, width x2 of each of one side second region portion 1b4 and other side second region portion 1b5 along off direction a11 is not less than 20 μm and not more than 120 μm. Width x2 of one side second region portion 1b4 and other side second region portion 1b5 may be equal or different between these portions.

Image-captured region SC1 in the alignment of silicon carbide substrate 10 using first alignment mark 1 includes first region 1a of first alignment mark 1, and does not include one side second region portion 1b4 and other side second region portion 1b5. That is, width x3 of image-captured region SC1 along off direction a11 is greater than width x1 of first region 1a, and width y3 of image-captured region SC1 along direction a21 perpendicular to off direction a11 is smaller than width y1 of first region 1a. Image-captured region SC1 includes a region sandwiched between one side second region portion 1b4 and other side second region portion 1b5. Image-captured region SC2 in the alignment step using second alignment mark 2 is configured similarly.

Figure 27:
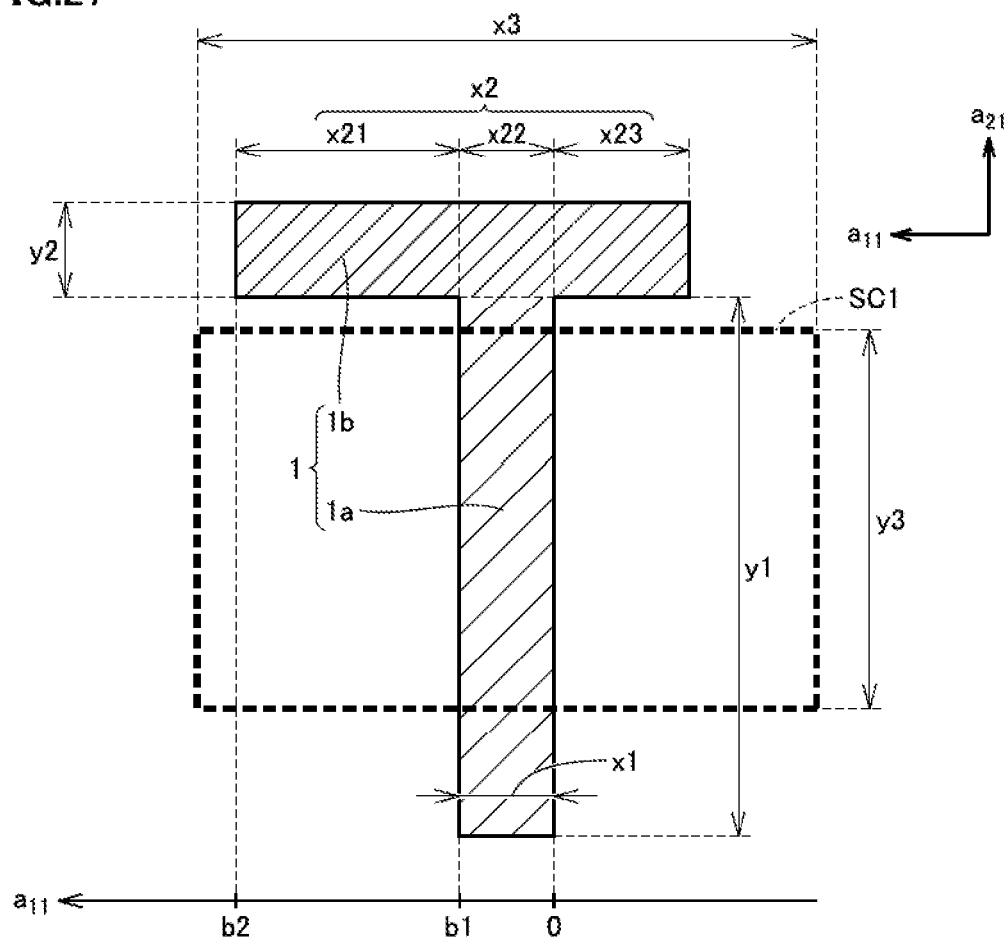
FIG. 27 is a schematic plan view schematically showing the structure of Variation 3 of the first alignment mark.

The structure of Variation 3 of first alignment mark 1 is now described. Referring to FIG. 27, second region 1b is provided in contact with one end portion of first region 1a, and may include a portion projecting from first region 1a in off direction a11 and a portion projecting from first region 1a in a direction opposite to off direction a11. When off direction a11 is the [11-20] direction, for example, the direction opposite to off direction a11 is a [-1-120] direction. A width x21 of the portion of second region 1b projecting in off direction a11 may be greater than a width x23 of the portion of second region 1b projecting in the direction opposite to off direction a11. A width x22 of a portion of second region 1b in contact with first region 1a may be equal to width x1 of first region 1a.

Figure 28:
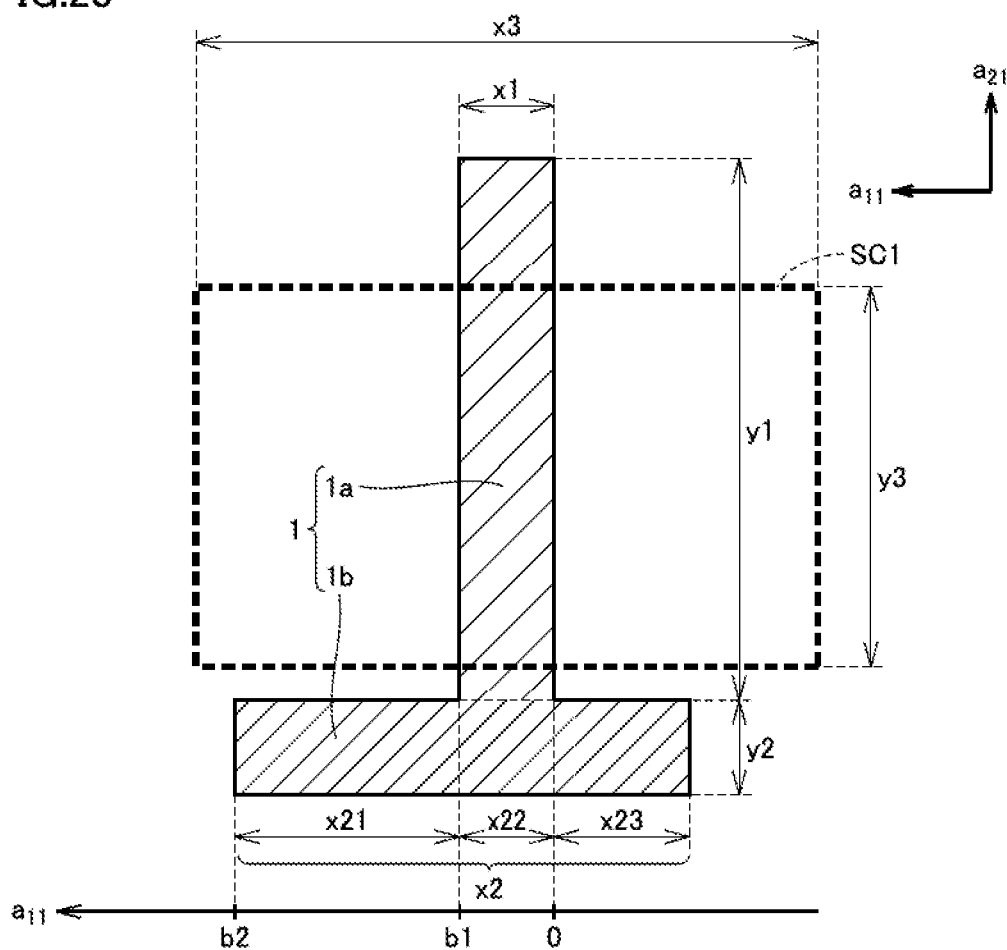
FIG. 28 is a schematic plan view schematically showing the structure of Variation 4 of the first alignment mark.

The structure of Variation 4 of first alignment mark 1 is now described. Referring to FIG. 28, second region 1b is provided in contact with the other end portion of first region 1a, and may include a portion projecting from first region 1a in off direction a11 and a portion projecting from first region 1a in a direction opposite to off direction a11. When off direction a11 is the [11-20] direction, for example, the direction opposite to off direction a11 is the [-1-120] direction. Width x21 of the portion of second region 1b projecting in off direction a11 may be greater than width x23 of the portion of second region 1b projecting in the direction opposite to off direction a11. Width x22 of a portion of second region 1b in contact with first region 1a may be equal to width x1 of first region 1a.

Figure 29:
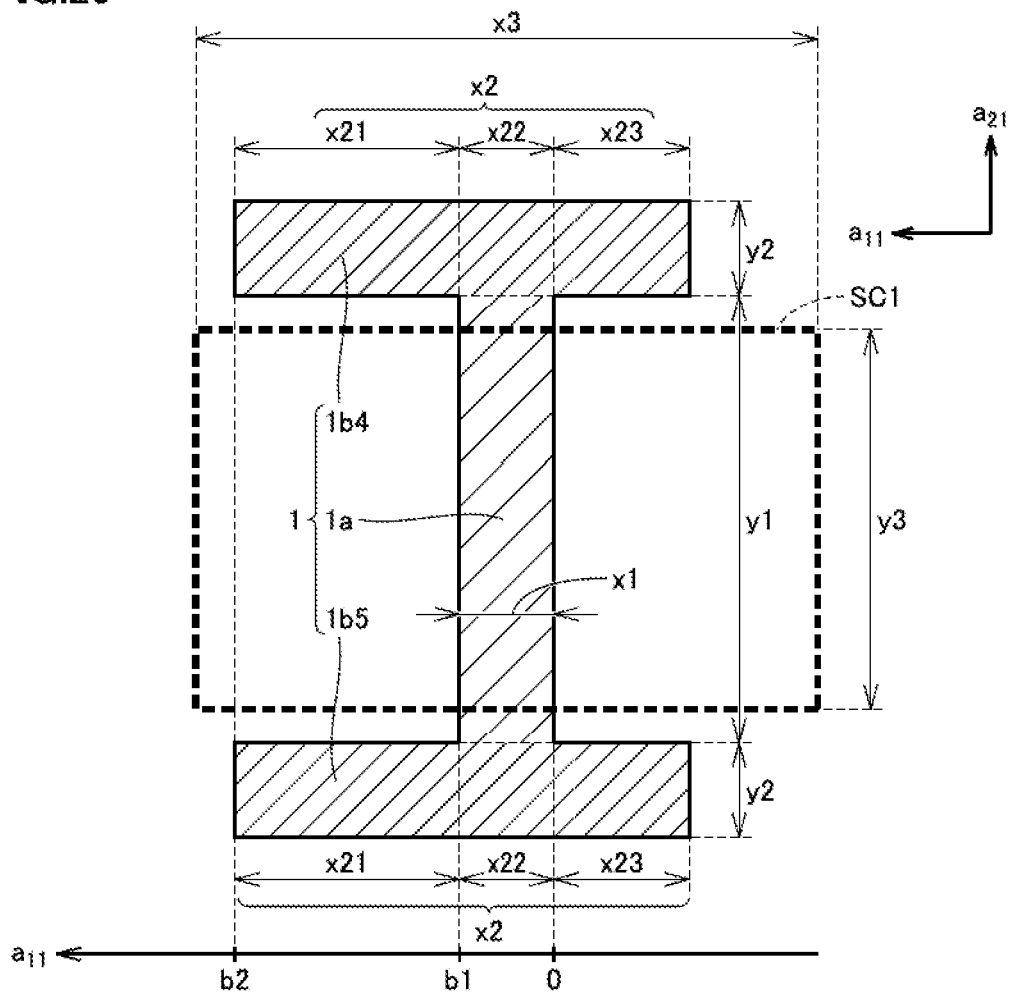
FIG. 29 is a schematic plan view schematically showing the structure of Variation 5 of the first alignment mark.

The structure of Variation 5 of first alignment mark 1 is now described. Referring to FIG. 29, one side second region portion 1b4 is provided in contact with one end portion of first region 1a, and may include a portion projecting from first region 1a in off direction a11 and a portion projecting from first region 1a in a direction opposite to off direction a11. When off direction a11 is the [11-20] direction, for example, the direction opposite to off direction a11 is the [-1-120] direction. Width x21 of the portion of one side second region portion 1b4 projecting in off direction a11 may be greater than width x23 of the portion of one side second region portion 1b4 projecting in the direction opposite to off direction a11. Width x22 of a portion of one side second region portion 1b4 in contact with first region 1a may be equal to width x1 of first region 1a. Similarly, other side second region portion 1b5 is provided in contact with the other end portion of first region 1a, and may include a portion projecting from first region 1a in off direction a11 and a portion projecting from first region 1a in a direction opposite to off direction a11. When off direction a11 is the [11-20] direction, for example, the direction opposite to off direction a11 is the [-1-120] direction. Width x21 of the portion of other side second region portion 1b5 projecting in off direction a11 may be greater than width x23 of the portion of other side second region portion 1b5 projecting in the direction opposite to off direction a11. Width x22 of a portion of other side second region portion 1b5 in contact with first region 1a may be equal to width x1 of first region 1a. Image-captured region SC1 includes a region sandwiched between one side second region portion 1b4 and other side second region portion 1b5.

Figure 30:
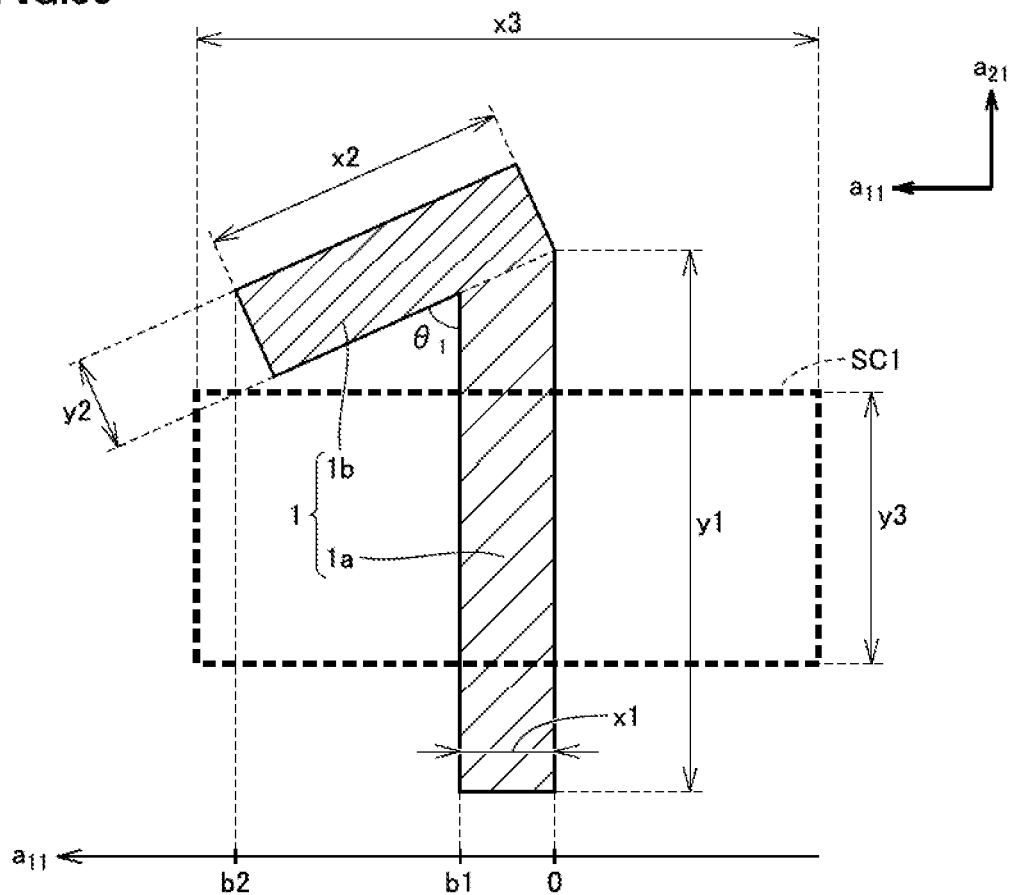
FIG. 30 is a schematic plan view schematically showing the structure of Variation 6 of the first alignment mark.

The structure of Variation 6 of first alignment mark 1 is now described. Referring to FIG. 30, second region 1b is provided in contact with one end portion of first region 1a, and may be inclined from off direction a11 toward first region 1a. When off direction a11 is the [11-20] direction, direction a21 perpendicular to the off direction is the [1-100] direction, and a direction opposite to direction a21 perpendicular to the off direction is the [−1100] direction, for example, second region 1b is inclined from the [11-20] direction toward the [−1100] direction. An inclination angle θ1 formed between first region 1a and second region 1b is not more than 600, for example. In order to keep second region 1b out of image-captured region SC1, if inclination angle θ1 is greater than 60°, the length of second region 1b in off direction a11 will be too short.

Figure 31:
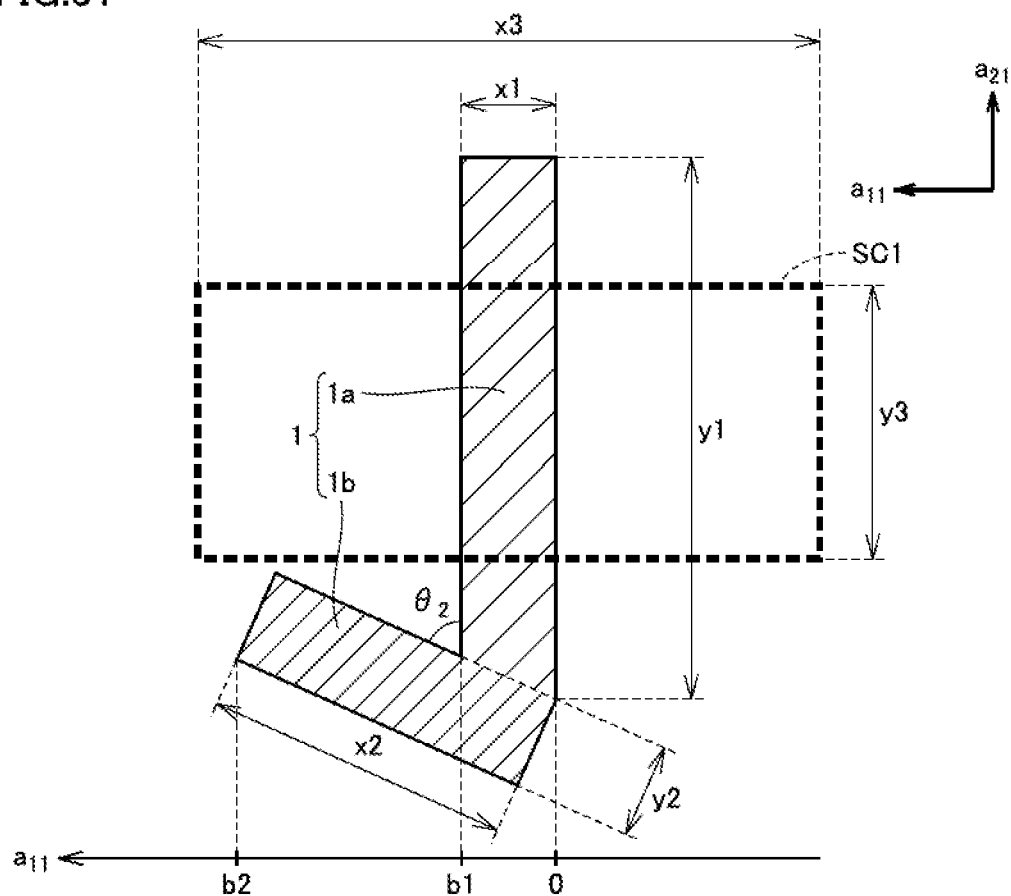
FIG. 31 is a schematic plan view schematically showing the structure of Variation 7 of the first alignment mark.

The structure of Variation 7 of first alignment mark 1 is now described. Referring to FIG. 31, second region 1b is provided in contact with the other end portion of first region 1a, and may be inclined from off direction a11 toward first region 1a. When off direction a11 is the [11-20] direction, direction a21 perpendicular to the off direction is the [1-100] direction, and a direction opposite to direction a21 perpendicular to the off direction is the [−1100] direction, for example, second region 1b is inclined from the [11-20] direction toward the [1-100] direction. An inclination angle θ2 formed between first region 1a and second region 1b is not more than 60°, for example. In order to keep second region 1b out of image-captured region SC1, if inclination angle θ2 is greater than 60°, the length of second region 1b in off direction a11 will be too short.

Figure 32:
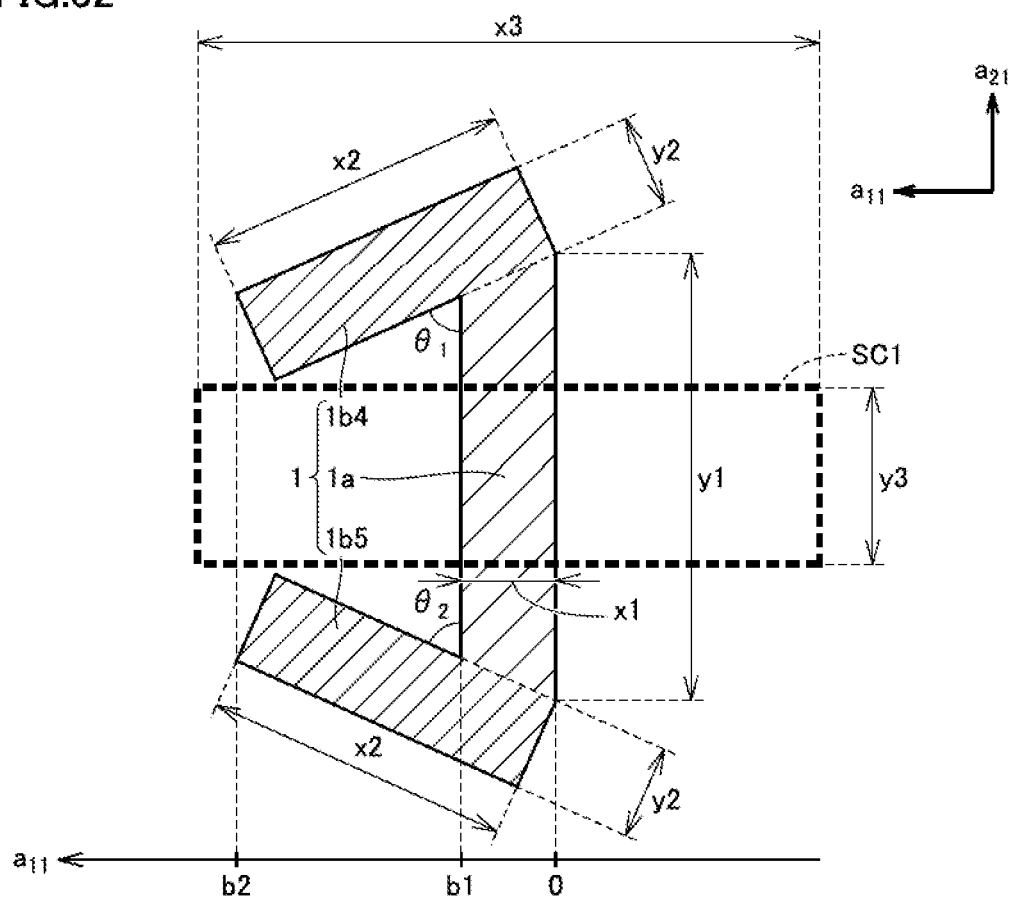
FIG. 32 is a schematic plan view schematically showing the structure of Variation 8 of the first alignment mark.

The structure of Variation 8 of first alignment mark 1 is now described. Referring to FIG. 32, one side second region portion 1b4 is provided in contact with one end portion of first region 1a, and may be inclined from off direction a11 toward first region 1a. When off direction a11 is the [11-20] direction, direction a21 perpendicular to the off direction is the [1-100] direction, and a direction opposite to direction a21 perpendicular to the off direction is the [−1100] direction, for example, one side second region portion 1b4 is inclined from the [11-20] direction toward the [−1100] direction. Other side second region portion 1b5 is provided in contact with the other end portion of first region 1a, and may be inclined from off direction a11 toward first region 1a. When off direction a11 is the [11-20] direction, direction a21 perpendicular to the off direction is the [1-100] direction, and a direction opposite to direction a21 perpendicular to the off direction is the [−1100] direction, for example, other side second region portion 1b5 is inclined from the [11-20] direction toward the [1-100] direction. Inclination angle θ1 may be similar to that in Variation 6, and inclination angle θ2 may be similar to that in Variation 7.

Figure 33:
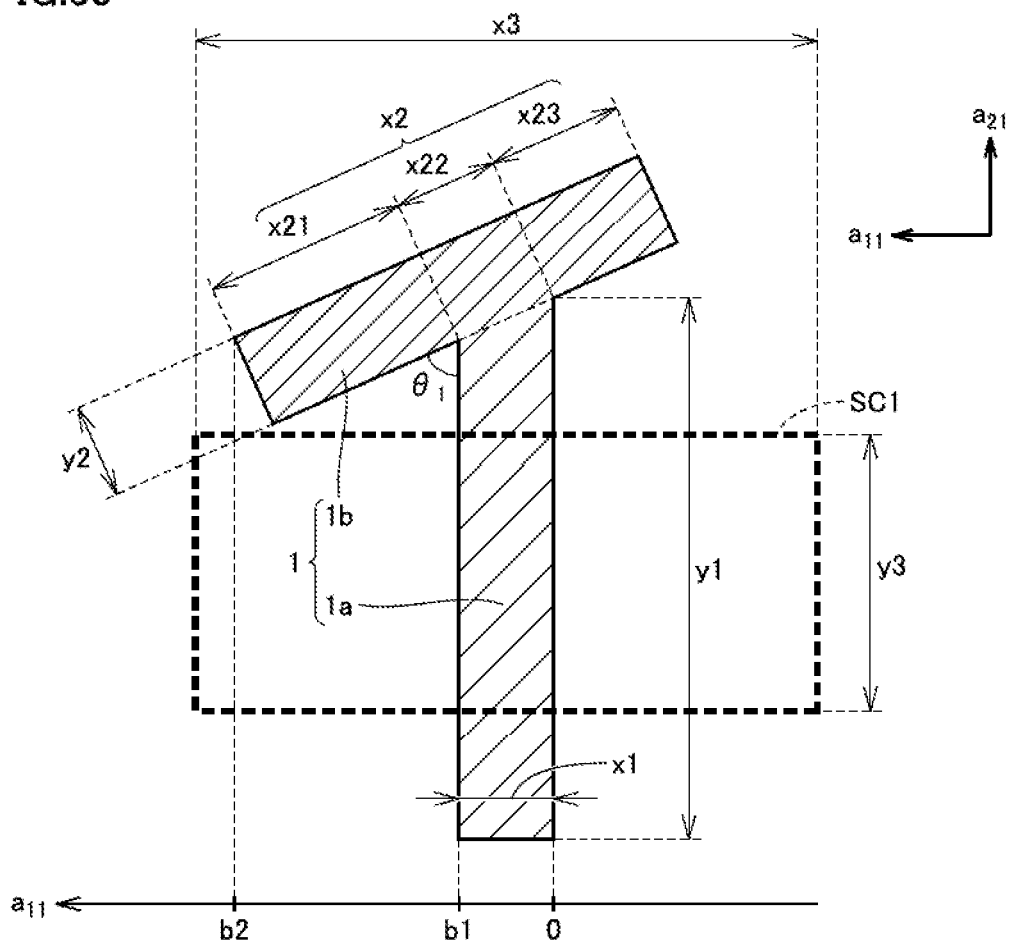
FIG. 33 is a schematic plan view schematically showing the structure of Variation 9 of the first alignment mark.

The structure of Variation 9 of first alignment mark 1 is now described. Referring to FIG. 33, second region 1b is provided in contact with one end portion of first region 1a, and inclined at inclination angle θ1 from off direction a11 toward first region 1a. Second region 1b may include a portion projecting from first region 1a in the inclined direction, and a portion projecting from first region 1a in a direction opposite to the inclined direction. Width x21 of the portion of second region 1b projecting in the inclined direction may be greater than width x23 of the portion of second region 1b projecting in the direction opposite to the inclined direction. The inclined direction may be similar to that in Variation 6.

Figure 34:
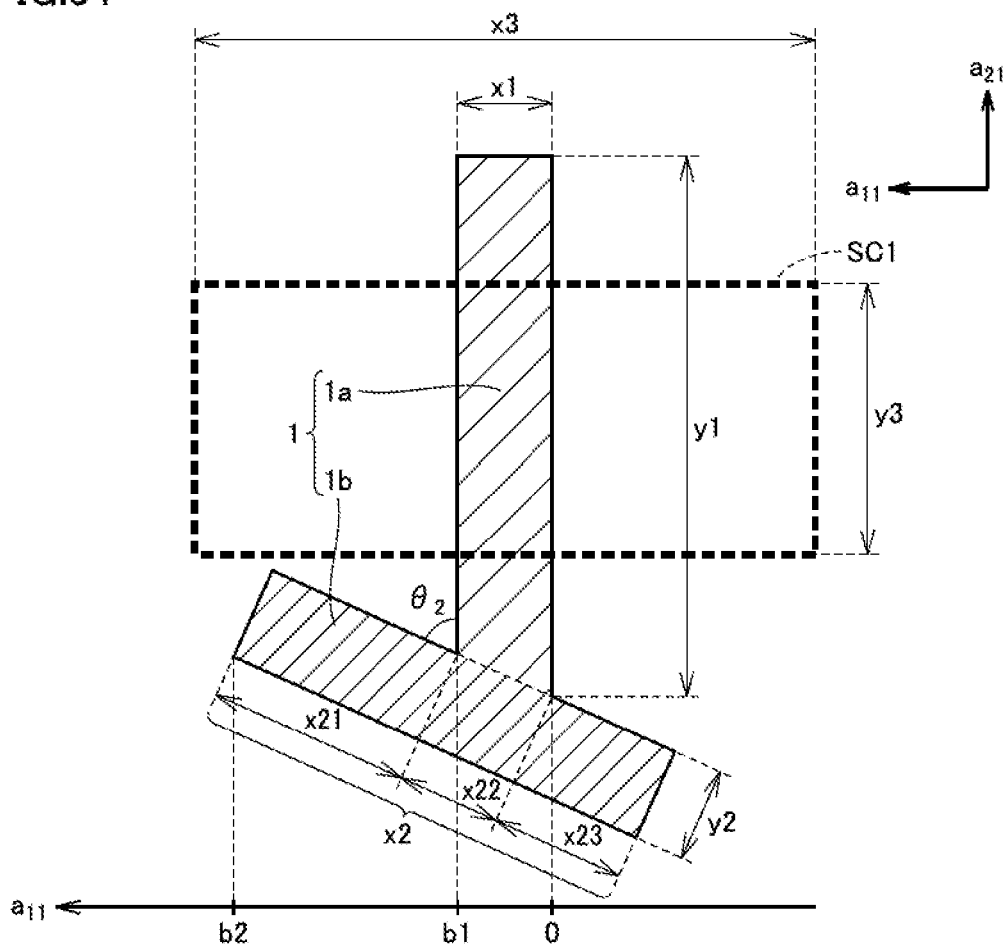
FIG. 34 is a schematic plan view schematically showing the structure of Variation 10 of the first alignment mark.

The structure of Variation 10 of first alignment mark 1 is now described. Referring to FIG. 34, second region 1b is provided in contact with the other end portion of first region 1a, and inclined at inclination angle θ2 from off direction a11 toward first region 1a. Second region 1b may include a portion projecting from first region 1a in the inclined direction, and a portion projecting from first region 1a in a direction opposite to the inclined direction. Width x21 of the portion of second region 1b projecting in the inclined direction may be greater than width x23 of the portion of second region 1b projecting in the direction opposite to the inclined direction. The inclined direction may be similar to that in Variation 7.

Figure 35:
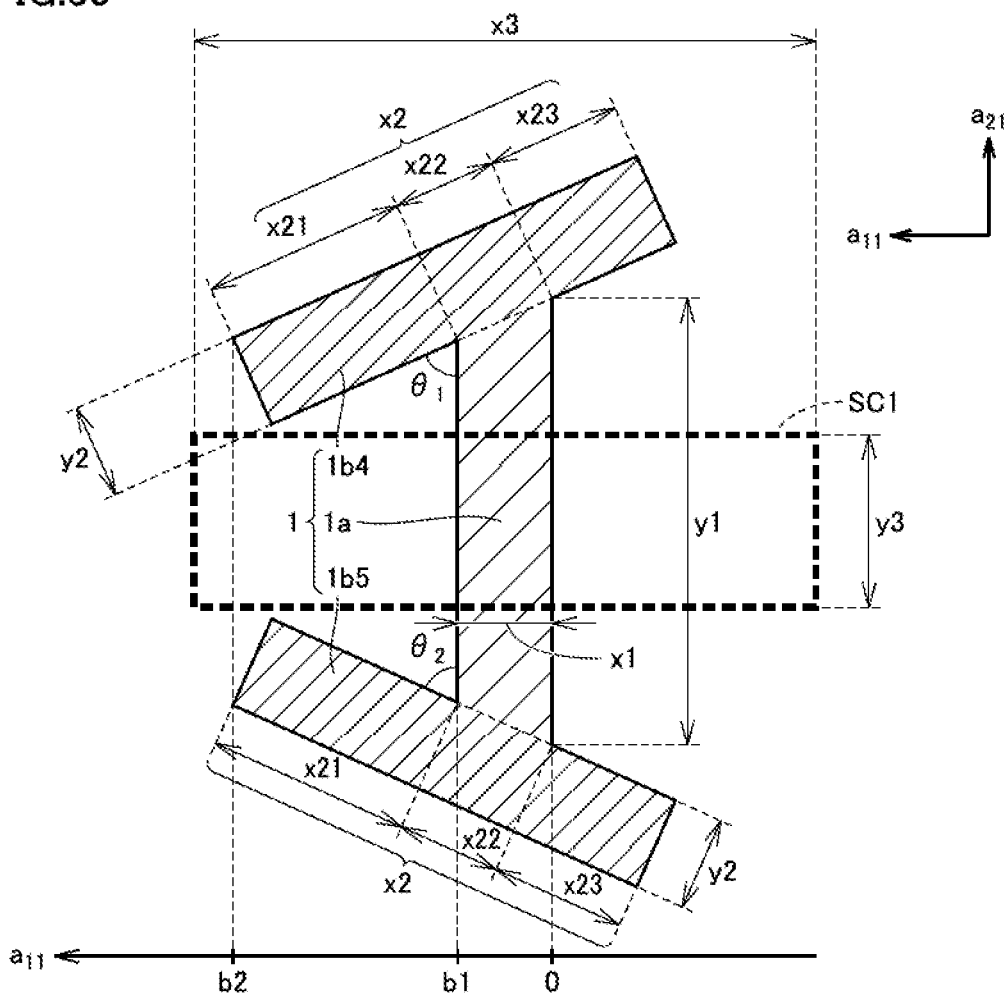
FIG. 35 is a schematic plan view schematically showing the structure of Variation 11 of the first alignment mark.

The structure of Variation 11 of first alignment mark 1 is now described. Referring to FIG. 35, one side second region portion 1b4 is provided in contact with one end portion of first region 1a, and inclined at inclination angle θ1 from off direction a11 toward first region 1a. One side second region portion 1b4 may include a portion projecting from first region 1a in the inclined direction, and a portion projecting from first region 1a in a direction opposite to the inclined direction. Width x21 of the portion of one side second region portion 1b4 projecting in the inclined direction may be greater than width x23 of the portion of one side second region portion 1b4 projecting in the direction opposite to the inclined direction. The inclined direction is similar to that in Variation 6. Similarly, other side second region portion 1b5 is provided in contact with the other end portion of first region 1a, and inclined at inclination angle θ2 from off direction a11 toward first region 1a. Other side second region portion 1b5 may include a portion projecting from first region 1a in the inclined direction, and a portion projecting from first region 1a in a direction opposite to the inclined direction. Width x21 of the portion of other side second region portion 1b5 projecting in the inclined direction may be greater than width x23 of the portion of other side second region portion 1b5 projecting in the direction opposite to the inclined direction. The inclined direction is similar to that in Variation 7.

Figure 36:
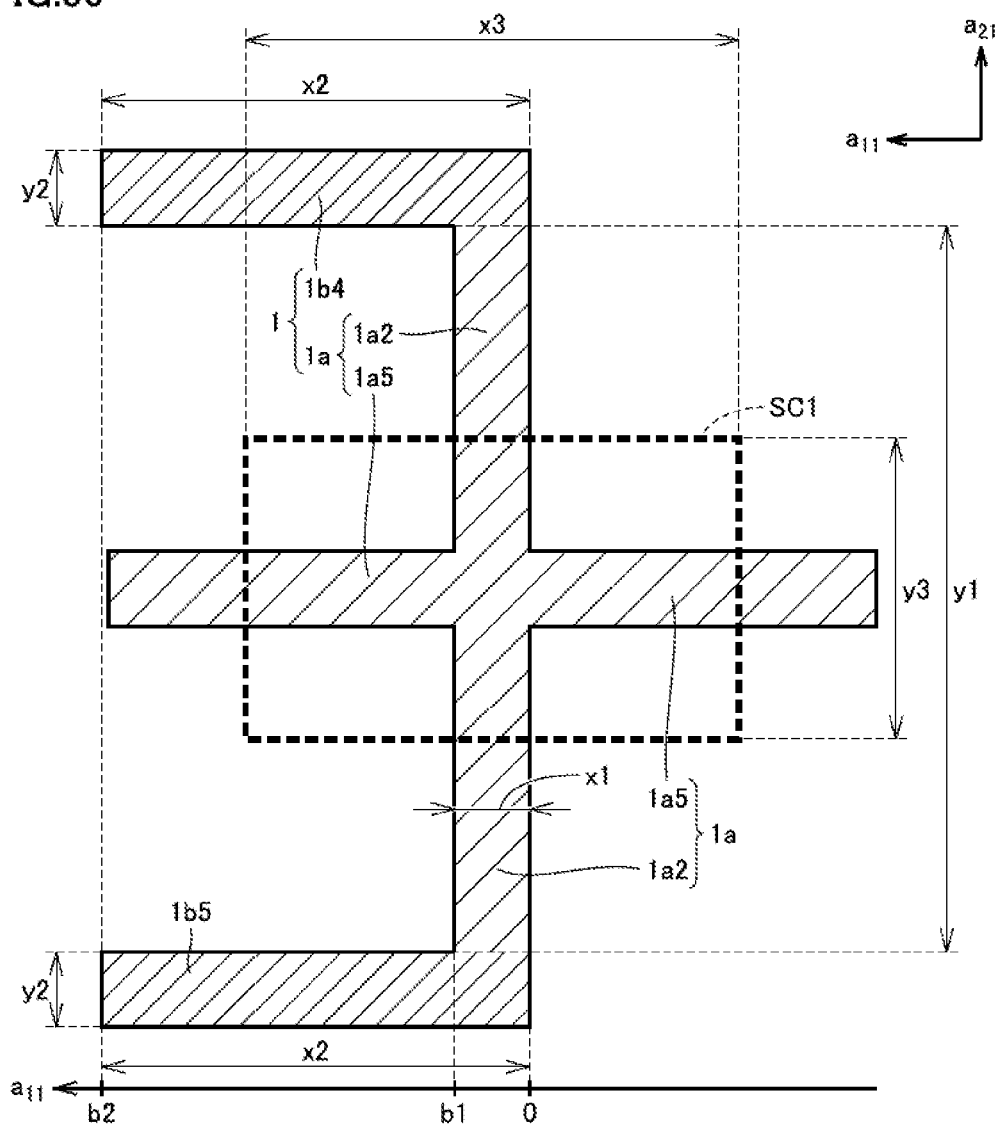
FIG. 36 is a schematic plan view schematically showing the structure of Variation 12 of the first alignment mark.

The structure of Variation 12 of first alignment mark 1 is now described. Referring to FIG. 36, first region 1a has a cross shape when viewed from the normal direction of first main surface 10a. That is, first region 1a includes a horizontal first region portion 1a5 extending along off direction a11, and a perpendicular first region portion 1a2 extending along direction a21 perpendicular to off direction a11. Perpendicular first region portion 1a2 is provided to perpendicularly cross horizontal first region portion 1a5. Second region 1b may include one side second region portion 1b4 and other side second region portion 1b5. One side second region portion 1b4 is in contact with one end portion of perpendicular first region portion 1a2 in direction a21 perpendicular to off direction a11 within first main surface 10a. Other side second region portion 1b5 is in contact with the other end portion of perpendicular first region portion 1a2 in direction a21 perpendicular to off direction a11 within first main surface 10a. When off direction a11 is the [11-20] direction, for example, the one side in direction a21 perpendicular to off direction a11 within first main surface 10a is the [1-100] direction, and the other side is the [−1100] direction.

Image-captured region SC1 in the alignment of silicon carbide substrate 10 using first alignment mark 1 includes perpendicular first region portion 1a2 and horizontal first region portion 1a5, and does not include one side second region portion 1b4 and other side second region portion 1b5. That is, image-captured region SC1 includes a portion where perpendicular first region portion 1a2 and horizontal first region portion 1a5 cross each other. Image-captured region SC2 in the alignment step using second alignment mark 2 is configured similarly.

Figure 37:
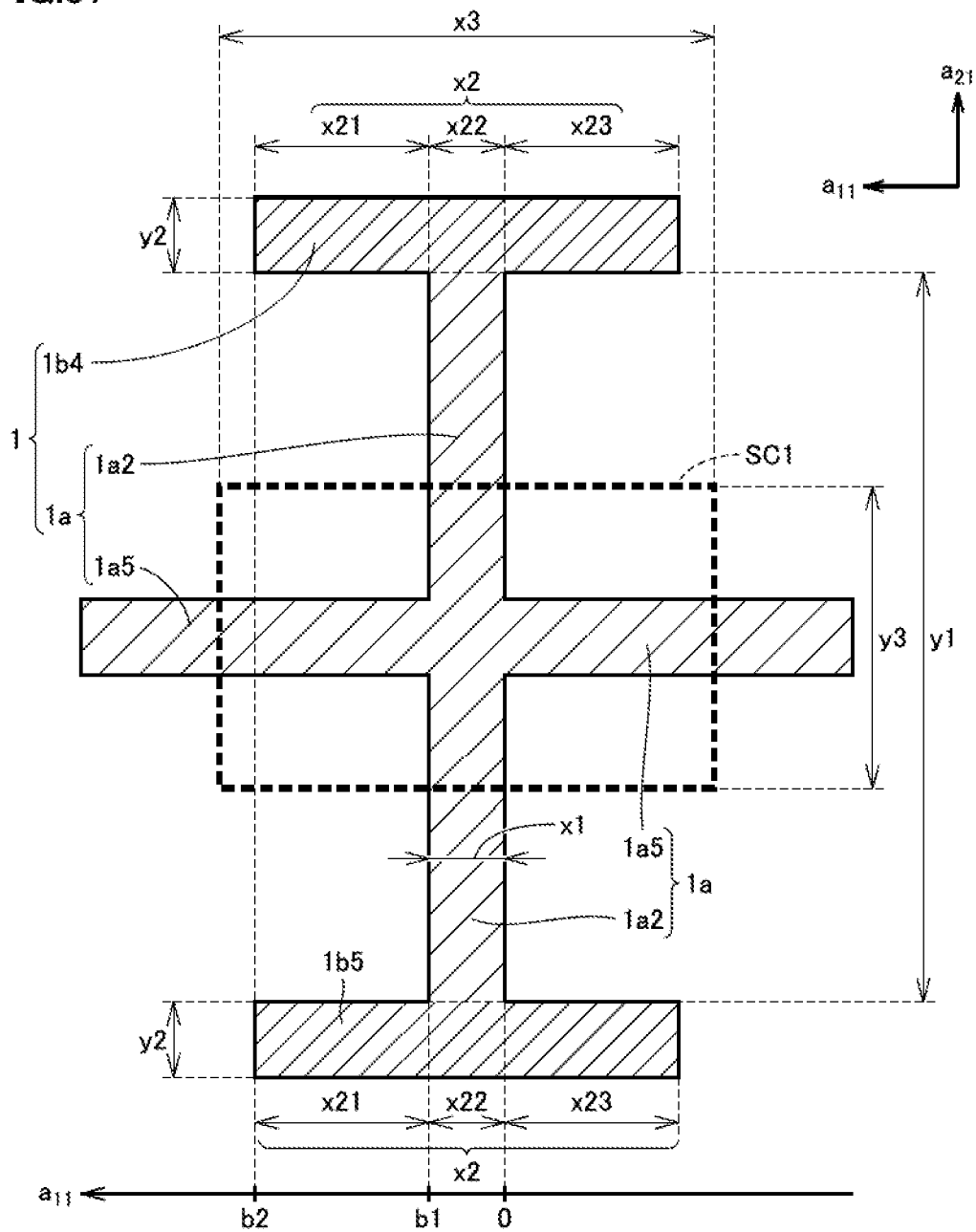
FIG. 37 is a schematic plan view schematically showing the structure of Variation 13 of the first alignment mark.

The structure of Variation 13 of first alignment mark 1 is now described. Referring to FIG. 37, in the first alignment mark according to Variation 13, one side second region portion 1b4 is provided in contact with one end portion of perpendicular first region portion 1a2, and may include a portion projecting from perpendicular first region portion 1a2 in off direction a11 and a portion projecting from perpendicular first region portion 1a2 in a direction opposite to off direction a11. When off direction a11 is the [11-20] direction, for example, the direction opposite to off direction a11 is the [−1-120] direction. Width x21 of the portion of one side second region portion 1b4 projecting in off direction a11 may be substantially equal to width x23 of the portion of one side second region portion 1b4 projecting in the direction opposite to off direction a11. Width x22 of a portion of one side second region portion 1b4 in contact with first region 1a may be equal to width x1 of first region 1a. Similarly, other side second region portion 1b5 is provided in contact with the other end portion of perpendicular first region portion 1a2, and may include a portion projecting from perpendicular first region portion 1a2 in off direction a11 and a portion projecting from perpendicular first region portion 1a2 in a direction opposite to off direction a11. When off direction a11 is the [11-20] direction, for example, the direction opposite to off direction a11 is the [−1-120] direction. Width x21 of the portion of other side second region portion 1b5 projecting in off direction a11 may be substantially equal to width x23 of the portion of other side second region portion 1b5 projecting in the direction opposite to off direction a11. Width x22 of a portion of other side second region portion 1b5 in contact with first region 1a may be equal to width x1 of first region 1a. Image-captured region SC1 includes a region sandwiched between one side second region portion 1b4 and other side second region portion b5.

Figure 38:
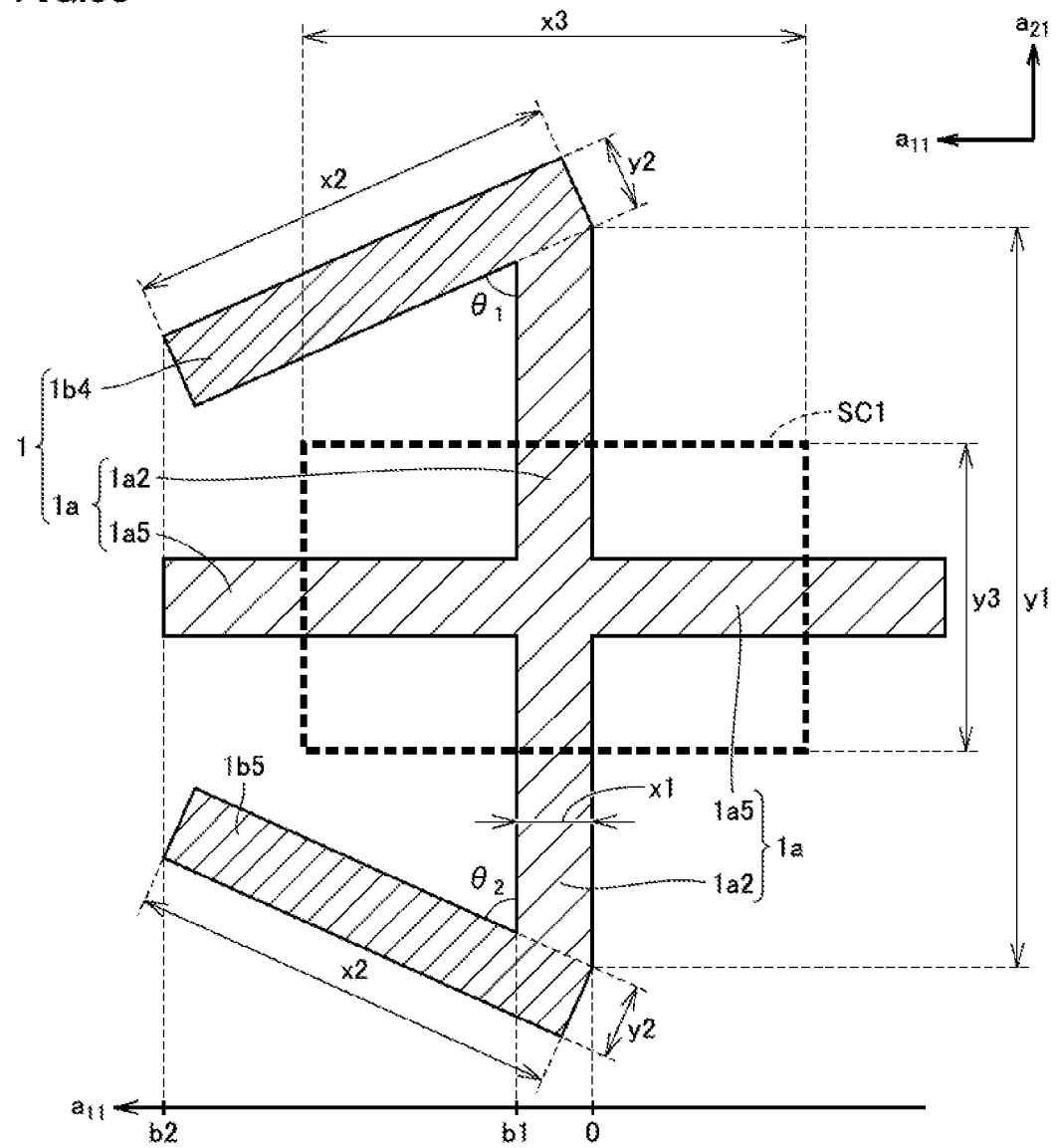
FIG. 38 is a schematic plan view schematically showing the structure of Variation 14 of the first alignment mark.

The structure of Variation 14 of first alignment mark 1 is now described. Referring to FIG. 38, in the first alignment mark according to Variation 14, one side second region portion 1b4 is provided in contact with one end portion of perpendicular first region portion 1a2, and may be inclined from off direction a11 toward perpendicular first region portion 1a2. When off direction a11 is the [11-20] direction, direction a21 perpendicular to the off direction is the [1-100] direction, and a direction opposite to direction a21 perpendicular to the off direction is the [−1100] direction, for example, one side second region portion 1b4 is inclined from the [11-20] direction toward the [−1100] direction. Other side second region portion 1b5 is provided in contact with the other end portion of perpendicular first region portion 1a2, and may be inclined from off direction a11 toward perpendicular first region portion 1a2. When off direction a11 is the [111-20] direction, direction a21 perpendicular to the off direction is the [1-100] direction, and a direction opposite to direction a21 perpendicular to the off direction is the [−1100] direction, for example, other side second region portion 1b5 is inclined from the [11-20] direction toward the [1-100] direction. Inclination angle θ1 may be similar to that in Variation 6, and inclination angle θ2 may be similar to that in Variation 7.

Figure 39:
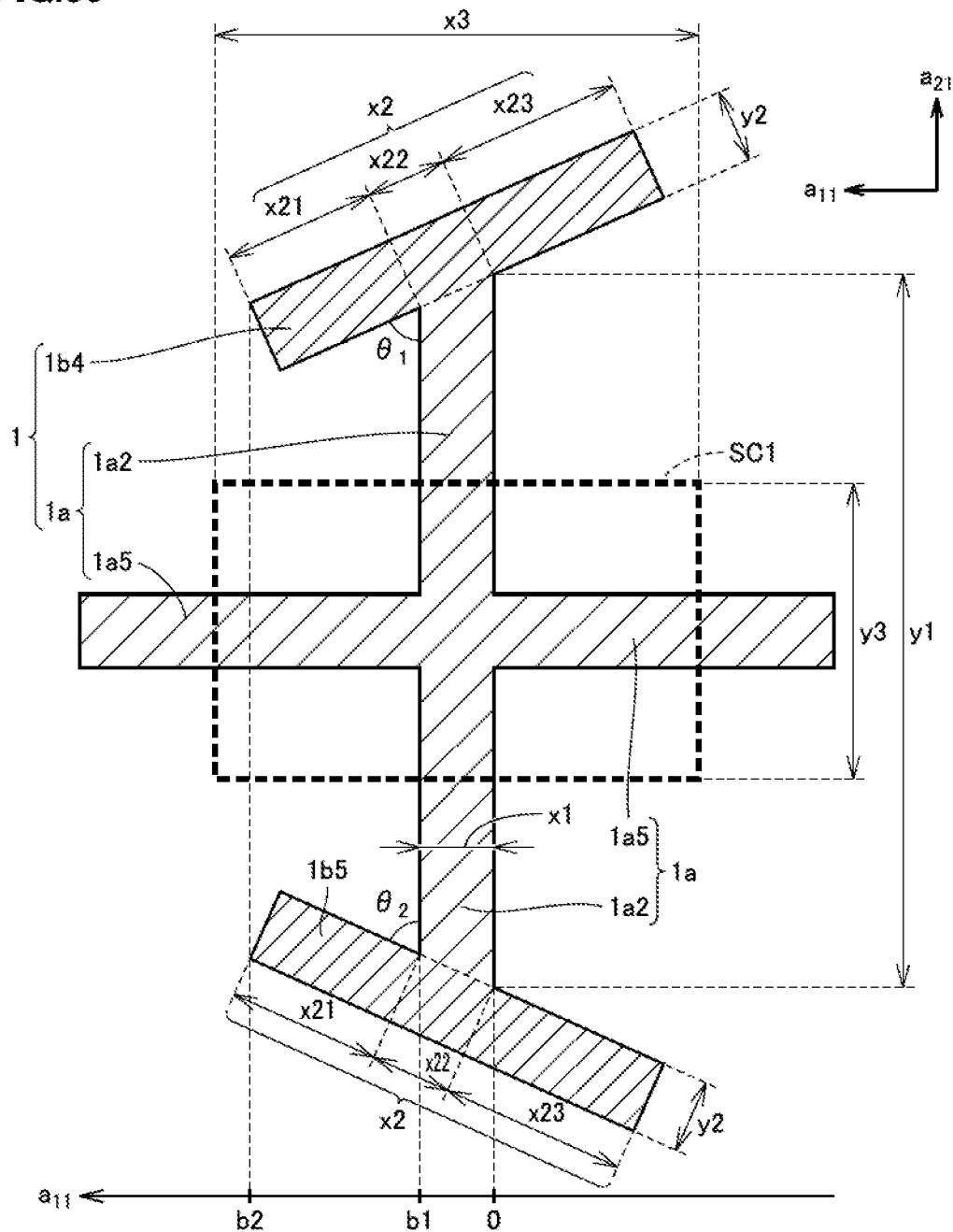
FIG. 39 is a schematic plan view schematically showing the structure of Variation 15 of the first alignment mark.

The structure of Variation 15 of first alignment mark 1 is now described. Referring to FIG. 39, in the first alignment mark according to Variation 15, one side second region portion 1b4 is provided in contact with one end portion of perpendicular first region portion 1a2, and inclined at inclination angle 81 from off direction a11 toward perpendicular first region portion 1a2. One side second region portion 1b4 may include a portion projecting from perpendicular first region portion 1a2 in the inclined direction, and a portion projecting from perpendicular first region portion 1a2 in a direction opposite to the inclined direction. Width x21 of the portion of one side second region portion 1b4 projecting in the inclined direction may be smaller than width x23 of the portion of one side second region portion 1b4 projecting in the direction opposite to the inclined direction. The inclined direction is similar to that in Variation 6. Similarly, other side second region portion 1b5 is provided in contact with the other end portion of perpendicular first region portion 1a2, and inclined at inclination angle θ2 from off direction a11 toward perpendicular first region portion 1a2. Other side second region portion 1b5 may include a portion projecting from perpendicular first region portion 1a2 in the inclined direction, and a portion projecting from perpendicular first region portion 1a2 in a direction opposite to the inclined direction. Width x21 of the portion of other side second region portion 1b5 projecting in the inclined direction may be greater than width x23 of the portion of other side second region portion 1b5 projecting in the direction opposite to the inclined direction. The inclined direction is similar to that in Variation 7.

While silicon carbide semiconductor device 100 has been described as a MOSFET in the above embodiment, silicon carbide semiconductor device 100 is not limited to a MOSFET. For example, silicon carbide semiconductor device 100 may be a Schottky barrier diode or an IGBT (Insulated Gate Bipolar Transistor). While the first conductivity type has been described as n type and the second conductivity type has been described as p type in the above embodiment, the first conductivity type may be p type and the second conductivity type may be n type. While the alignment step has been described as being performed when forming the contact region in the above embodiment, the alignment step is not limited to forming the contact region. For example, the alignment step may be performed in a silicon carbide dry etching step, a gate electrode formation step or a step of forming a contact hole in the interlayer insulating film. While second alignment mark 2 has been described as being used for the alignment in the exposure step in the above embodiment, second alignment mark 2 is not limited to be used in the exposure step. For example, second alignment mark 2 may be used in a defect inspection step or a laser annealing step.

A function and effect of the method of manufacturing MOSFET 100 according to this embodiment is now described.

According to the method of manufacturing MOSFET 100 of this embodiment, first alignment mark 1 includes first region 1a and second region 1b, second region 1b being in contact with first region 1a and extending from first region 1a in off direction a11. First region 1a includes a short side along a direction parallel to off direction a11, and a long side along a direction perpendicular to off direction a11 within main surface 10a. Second alignment mark 2 includes a first portion 2a formed on first region 1a and a second portion 2b formed on second region 1b. An alignment step includes the step of capturing an image of first portion 2a while not including second portion 2b, and recognizing an edge of first portion 2a based on the image. Consequently, the alignment accuracy of silicon carbide substrate 10 can be improved.

Further, according to the method of manufacturing MOSFET 100 of this embodiment, second region 1b is in contact with one end portion of first region 1a in direction a21 perpendicular to off direction a11 within main surface 10b. Consequently, the image-captured region for the alignment can be increased to thereby further improve the alignment accuracy.

Moreover, according to the method of manufacturing MOSFET 100 of this embodiment, assuming that the width of second region 1b along off direction a11 is x, and the width of first region 1a along direction a21 perpendicular to off direction a11 within first main surface 10a is y, x is not less than y/3 and not more than 2y. Consequently, the silicon carbide can be efficiently grown at an end portion of second region 1b, thereby further improving the alignment accuracy.

Moreover, according to the method of manufacturing MOSFET 100 of this embodiment, second region 1b is inclined from off direction a11 toward first region 1a. Consequently, an end portion of first region 1a in off direction a11 can be protected by second region 1b. As a result, the edge of first portion 2a of second alignment mark. 2 facing off direction a11 becomes steeper, thereby improving the alignment accuracy.

Moreover, according to the method of manufacturing MOSFET 100 of this embodiment, second region 1b includes one side second region portion 1b4 in contact with one end portion of first region 1a in direction a21 perpendicular to off direction a11 within first main surface 10a, and other side second region portion 1b5 in contact with the other end portion. Consequently, the silicon carbide can be grown at the end portion of each of one side second region portion 1b4 and other side second region portion 1b5, thereby further improving the alignment accuracy.

Furthermore, according to the method of manufacturing MOSFET 100 of this embodiment, assuming that the width of each of one side second region portion 1b4 and other side second region portion 1b5 along off direction a11 is x, and the width of first region 1a along the direction perpendicular to the off direction within the main surface is y, x is not less than y/6 and not more than 3y. Consequently, the silicon carbide can be efficiently grown at the end portion of each of one side second region portion 1b4 and other side second region portion 1b5, thereby further improving the alignment accuracy.

Furthermore, according to the method of manufacturing MOSFET 100 of this embodiment, first region 1a has a rectangular shape when viewed from the normal direction of first main surface 10a. Consequently, the alignment mark can be suitably used for an alignment method using a rectangular alignment mark.

Furthermore, according to the method of manufacturing MOSFET 100 of this embodiment, first region 1a has a cross shape when viewed from the normal direction of first main surface 10a. Consequently, the alignment mark can be suitably used for an alignment method using a cross-shaped alignment mark.

Furthermore, according to the method of manufacturing MOSFET 100 of this embodiment, height H1 of first alignment mark 1 along the normal direction of first main surface 10a is 0.2 times or more of thickness 112 of the silicon carbide epitaxial layer along the normal direction of main surface 10a. Consequently, the second alignment mark, with a sufficient level difference can be formed, thereby effectively improving the alignment accuracy.

Moreover, according to the method of manufacturing MOSFET 100 of this embodiment, in the step of forming first alignment mark 1, first alignment mark 1 is formed on dicing line 3 on main surface 10a. By forming first alignment mark 1 on dicing line 3, the alignment accuracy can be improved without reducing the area where a semiconductor element is formed.

Moreover, the method of manufacturing MOSFET 100 of this embodiment further includes the step of forming relaxing region 71 within silicon carbide substrate 10 after the step of forming silicon carbide substrate 10. Consequently, the silicon carbide semiconductor device including relaxing region 71 can be obtained.

Moreover, the method of manufacturing MOSFET 100 of this embodiment further includes the step of forming at least one of contact region 84 and source electrode 94 in silicon carbide epitaxial layer 20 after the alignment step. Consequently, the alignment accuracy can be improved in the step of forming at least one of contact region 84 and source electrode 94.

Although the embodiments of the present invention have been described above, it should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A method of manufacturing a silicon carbide semiconductor device, comprising the steps of:
    preparing a silicon carbide substrate having a main surface angled off relative to a {0001} plane;
    forming a protruding first alignment mark on said main surface of said silicon carbide substrate;
    forming a second alignment mark on said first alignment mark by forming a silicon carbide epitaxial layer on said first alignment mark; and
    performing alignment of said silicon carbide substrate using said second alignment mark,
    said first alignment mark including a first region and a second region, said second region being in contact with said first region and extending from said first region in an off direction in which a <0001> direction is projected onto said main surface,
    said first region including a short side along a direction parallel to said off direction, and a long side along a direction perpendicular to said off direction within said main surface,
    said second alignment mark including a first portion formed on said first region and a second portion formed on said second region,
    said step of performing alignment including the step of capturing an image of said first portion while not including said second portion, and recognizing an edge of said first portion based on said image.

2. The method of manufacturing a silicon carbide semiconductor device according to claim 1, wherein
    said second region is in contact with one end portion of said first region in the direction perpendicular to said off direction within said main surface.

3. The method of manufacturing a silicon carbide semiconductor device according to claim 1, wherein
    assuming that a width of said second region along said off direction is x, and a width of said first region along the direction perpendicular to said off direction within said main surface is y, x is not less than y/3 and not more than 2y.

4. The method of manufacturing a silicon carbide semiconductor device according to claim 1, wherein
    said second region is inclined from said off direction toward said first region.

5. The method of manufacturing a silicon carbide semiconductor device according to claim 1, wherein
    said second region includes a one side second region portion in contact with one end portion of said first region in the direction perpendicular to said off direction within said main surface, and an other side second region portion in contact with the other end portion.

6. The method of manufacturing a silicon carbide semiconductor device according to claim 5, wherein
assuming that a width of each of said one side second region portion and said other side second region portion along said off direction is x, and a width of said first region along the direction perpendicular to said off direction within said main surface is y, x is not less than y/6 and not more than 3y.

7. The method of manufacturing a silicon carbide semiconductor device according to claim 1, wherein
said first region has a rectangular shape when viewed from a normal direction of said main surface.

8. The method of manufacturing a silicon carbide semiconductor device according to claim 1, wherein
said first region has a cross shape when viewed from a normal direction of said main surface.

9. The method of manufacturing a silicon carbide semiconductor device according to claim 1, wherein
a height of said first alignment mark along a normal direction of said main surface is 0.2 times or more of a thickness of said silicon carbide epitaxial layer along said normal direction of said main surface.

10. The method of manufacturing a silicon carbide semiconductor device according to claim 1, wherein
in said step of forming a protruding first alignment mark, said first alignment mark is formed on a dicing line on said main surface.

11. The method of manufacturing a silicon carbide semiconductor device according to claim 1, further comprising the step of forming a first impurity region within said silicon carbide substrate after said step of preparing a silicon carbide substrate.

12. The method of manufacturing a silicon carbide semiconductor device according to claim 1, further comprising the step of forming at least one of a second impurity region and an electrode in said silicon carbide epitaxial layer after said step of performing alignment.

* * * * *